United States Patent
Hershbarger

(10) Patent No.: US 7,839,938 B2
(45) Date of Patent: Nov. 23, 2010

(54) METHOD AND APPARATUS FOR CANCELLATION OF MAGNETIZING INDUCTANCE CURRENT IN A TRANSFORMER CIRCUIT

(75) Inventor: Russell Hershbarger, Nevada City, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 1184 days.

(21) Appl. No.: 11/477,136

(22) Filed: Jun. 27, 2006

(65) Prior Publication Data

US 2007/0014373 A1 Jan. 18, 2007

Related U.S. Application Data

(63) Continuation-in-part of application No. 10/857,469, filed on May 28, 2004, now Pat. No. 7,158,573.

(60) Provisional application No. 60/695,243, filed on Jun. 28, 2005, provisional application No. 60/474,009, filed on May 29, 2003.

(51) Int. Cl.
*H04B 3/00* (2006.01)
(52) U.S. Cl. ...................................... 375/258
(58) Field of Classification Search .............. 375/258, 375/257; 323/355, 356, 357
See application file for complete search history.

(56) References Cited

U.S. PATENT DOCUMENTS

| | | | | |
|---|---|---|---|---|
| 3,818,338 A * | 6/1974 | Chambers et al. | ............ | 324/127 |
| 3,881,149 A * | 4/1975 | Kiko | ............ | 323/356 |
| 4,096,363 A * | 6/1978 | Earp | ............ | 323/357 |
| 2004/0239487 A1* | 12/2004 | Hershbarger | ............ | 340/310.07 |

* cited by examiner

*Primary Examiner*—Temesghen Ghebretinsae

(57) ABSTRACT

A feedback method and apparatus for cancellation of magnetizing inductance current are presented. A voltage driver applies a voltage signal to a primary of a transformer. Feedback apparatus detect changes in the voltage driver output current that are attributable to magnetizing inductance current. Changes in output current are used to obtain a current error, which is integrated to control a current ramp generator. The output of the current ramp generator is applied to the transformer primary as a compensating current for canceling the magnetizing inductance current.

18 Claims, 18 Drawing Sheets

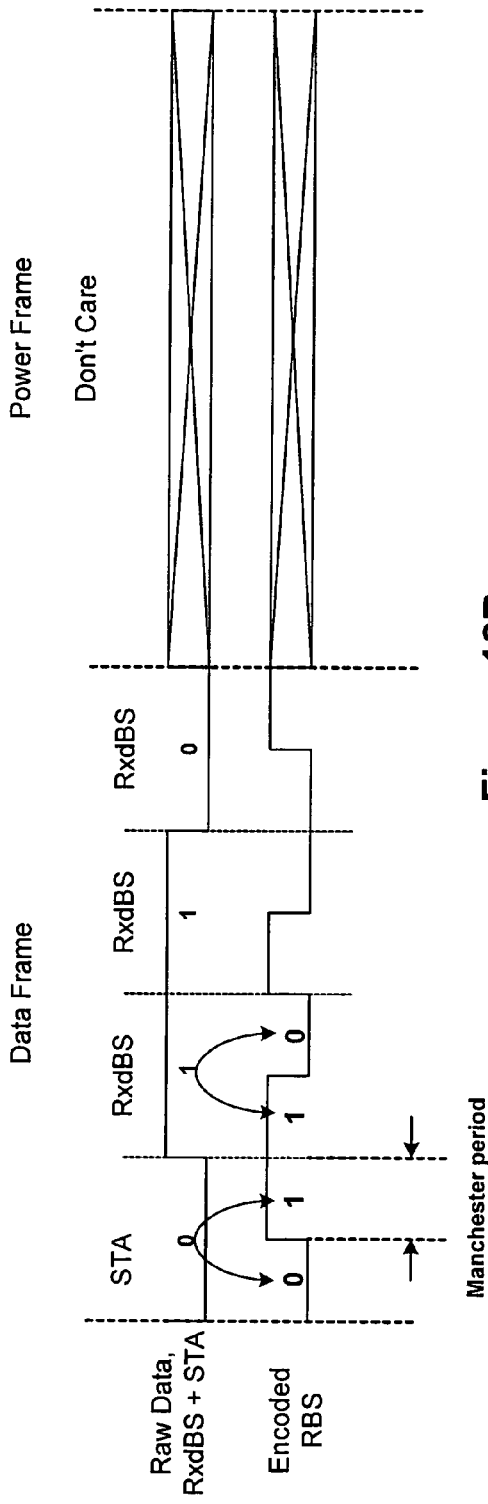
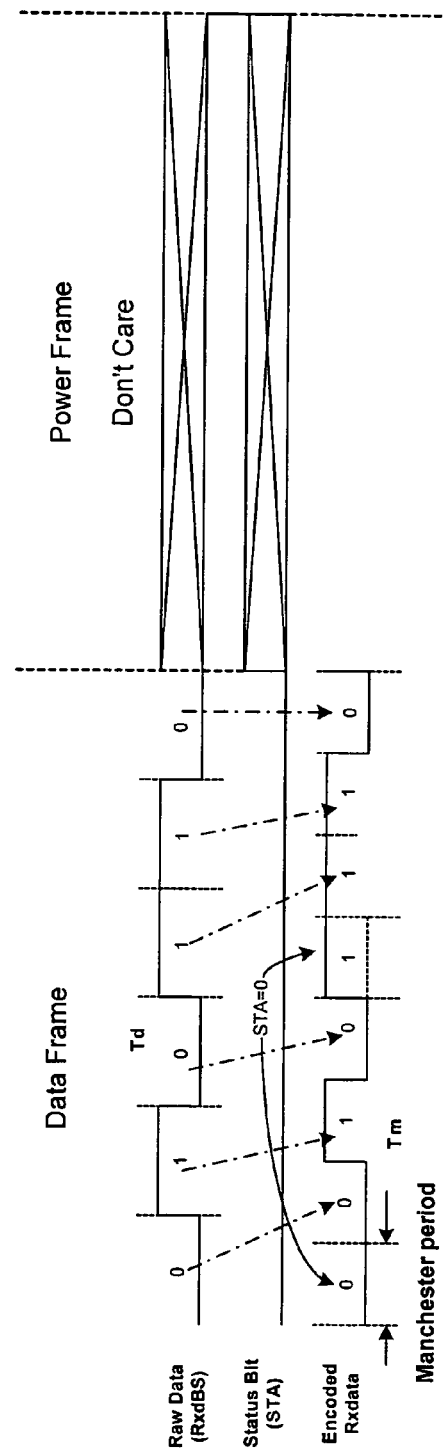
Figure 12B
Figure 12A

US 7,839,938 B2

METHOD AND APPARATUS FOR CANCELLATION OF MAGNETIZING INDUCTANCE CURRENT IN A TRANSFORMER CIRCUIT

CROSS REFERENCE TO RELATED APPLICATIONS

This application claims the benefit of priority from U.S. Provisional Application No. 60/695,243 filed on Jun. 28, 2005, entitled "Method And Apparatus For Cancellation Of Magnetizing Inductance Current In A Transformer Circuit"; and is a continuation-in-part of U.S. patent application Ser. No. 10/857,469, filed on May 28, 2004, entitled "A Method and Apparatus for Full Duplex Signaling Across a Transformer Circuit", which claims the benefit of priority from U.S. Provisional Application No. 60/474,009 filed on May 29,2003; the specifications of all of which are herein incorporated by reference in their entirety.

BACKGROUND OF INVENTION

1. Field of the Invention

This invention relates to the field of electronic communications. More specifically the invention relates to cancellation of magnetizing inductance current in a transformer circuit.

2. Background

An isolation barrier is generally used in applications in which it is desired to keep voltage potentials in one portion of a circuit isolated from voltages in another portion, e.g., to prevent relatively excessive and/or harmful voltages from entering a relatively low voltage or voltage sensitive circuit. Such applications may include, for example, telephony, medical, industrial, and other similar applications.

For example, in a telephony application, it may be necessary to protect communication circuitry from high voltages on the telephone line by placing an isolation barrier between the communication circuitry and the telephone line. However, while it is desirable to prevent harmful voltages from crossing from one side of an isolation barrier to the other, it is also desirable to facilitate signal communication between circuits on both sides of the barrier. In telephony applications, the isolation requirement is generally imposed by some governmental requirement (e.g., FCC part 68 in the US).

The transformer is one of several types of electrical devices that may be used as an element of an isolation barrier. However, in the prior art, digital communication across a transformer generally requires either a pulse transformer for each direction of communication, or time domain multiplexing of a pulse transformer (i.e., half-duplex communication). Prior art systems are incapable of full-duplex digital communication across a single transformer.

Half-duplex communication reduces communication bandwidth as each direction of communication must wait its turn to use the one-way signal channel. However, the use of multiple transformers to achieve two-way communication is expensive in terms of cost and space. A full duplex, single-transformer solution is therefore desired.

Unfortunately, the electrical characteristics of a transformer make it difficult to simultaneously drive a transmit signal onto, and detect a receive signal from, the same port of a transformer. For example, a transmit voltage signal driven across one port of a transformer gives rise to a load current component and a magnetizing inductance current component. The load current is proportional to the transmit voltage signal divided by the load impedance across the second port of the transformer. The magnetizing current on the other hand is generated by the inductance of the transformer coil being driven, and is proportional to the integral of the transmit voltage signal that appears across the first port of transformer. The value of the magnetizing current is thus dependent upon the history of the transmit signal.

For full-duplex signaling, it would be desirable and advantageous to have a system that can detect a receive signal across the same port of the transformer that is being used simultaneously to drive the transmit signal, in the presence of the load current and magnetizing current associated with the transmit signal.

SUMMARY OF INVENTION

The present invention provides a method and apparatus for cancellation of magnetizing inductance current in a transformer circuit. A feedback loop provides a compensating current that approximates the magnetized inductance current. The compensating current may then be applied to the port of the transformer to sink or source the magnetizing inductance current. With the magnetizing inductance current driven to a value at or near zero at predictable times, the remaining current component across the port of the transformer, which is channeled through the input driver in one or more embodiments, represents the transformer load current that can be advantageously used in detecting receive data.

In accordance with one or more embodiments, full duplex communication across a transformer may be accomplished by driving a first communication signal (referred to herein as "transmit data") across the transformer from a first side (e.g., the primary) to achieve communication in a first direction, and modulating the load impedance on the second side (e.g., the secondary) in accordance with a second communication signal (referred to herein as "receive data") to achieve communication in the reverse direction. The cancellation of the magnetized inductance current by an embodiment of the present invention allows modulation of the load impedance to be detected directly from the isolated load current.

In one or more embodiments, a current error discriminant may be obtained by sampling the current into/out of the port of the transformer at two different times (e.g., when the load current is known to be near zero due to double balancing of the transmit data, and when the magnetizing current is known to be at its maximum, while the absolute value of the input voltage signal and load impedance value remain constant), and then attributing the difference to magnetizing current. The sign of the error discriminant may be determined from the sign of the change in current and the state of the voltage input signal. A feedback loop may process the current error discriminant to provide a compensation control value for a current generator. The current generator may then supply the compensating current to cancel out the magnetizing inductance current at the transformer port and drive the error discriminant toward zero.

BRIEF DESCRIPTION OF THE DRAWINGS

FIG. 12A is a signal diagram illustrating the encoding of receive data in accordance with an embodiment of the present invention.

FIG. 12B is a signal diagram illustrating encoding of receive data in accordance with another embodiment of the present invention.

DETAILED DESCRIPTION

A method and apparatus for cancellation of magnetizing current in a transformer circuit are described. In the following description, numerous specific details are set forth to provide a more thorough description of embodiments of the invention. It will be apparent, however, to one skilled in the art that the invention may be practiced without these specific details. In other instances, well known features have not been described in detail so as not to obscure the invention.

Embodiments of the present invention may be used in communication circuits to support simultaneous, bi-directional communication across a transformer, for example, in connection with an isolation barrier of a DAA circuit. Thus, for purposes of illustration, the method and apparatus of the present invention will be described below within the context of a DAA isolation barrier implementation. Although the discussions herein are concentrated on the disclosed DAA environment, it should be apparent to those of skill in the art that the principles expounded herein are applicable to other applications wherein it is desired to cancel or balance the magnetizing inductance current of a transformer, or other inductive circuit or circuit component.

Implementation Example

DAA Embodiment

Signal communication across an isolation barrier is generally useful for telephony, medical, industrial, and other applications wherein it is desired to separate voltage potentials. In telephony applications, communication devices (e.g., computers, fax machines, etc.) typically connect to the PSTN (public switched telephone network) through modem devices to send and receive signals over the telephone lines.

A DAA circuit (data access arrangement) provides the interface between the modem device and the telephone lines, including the isolation barrier. The DAA may be described in terms of a "line side" (i.e., that portion of the circuitry that couples to the telephone line), a "host side" (i.e., that portion of the circuitry more closely associated with the host device; also referred to as the "modem side" or "DSP side"), and an isolation barrier that separates the line side and the host side. The isolation barrier may include one or more isolation elements, as well as one or more isolation element types (e.g., transformers, capacitors, optical couplers, etc.).

Figure 1:
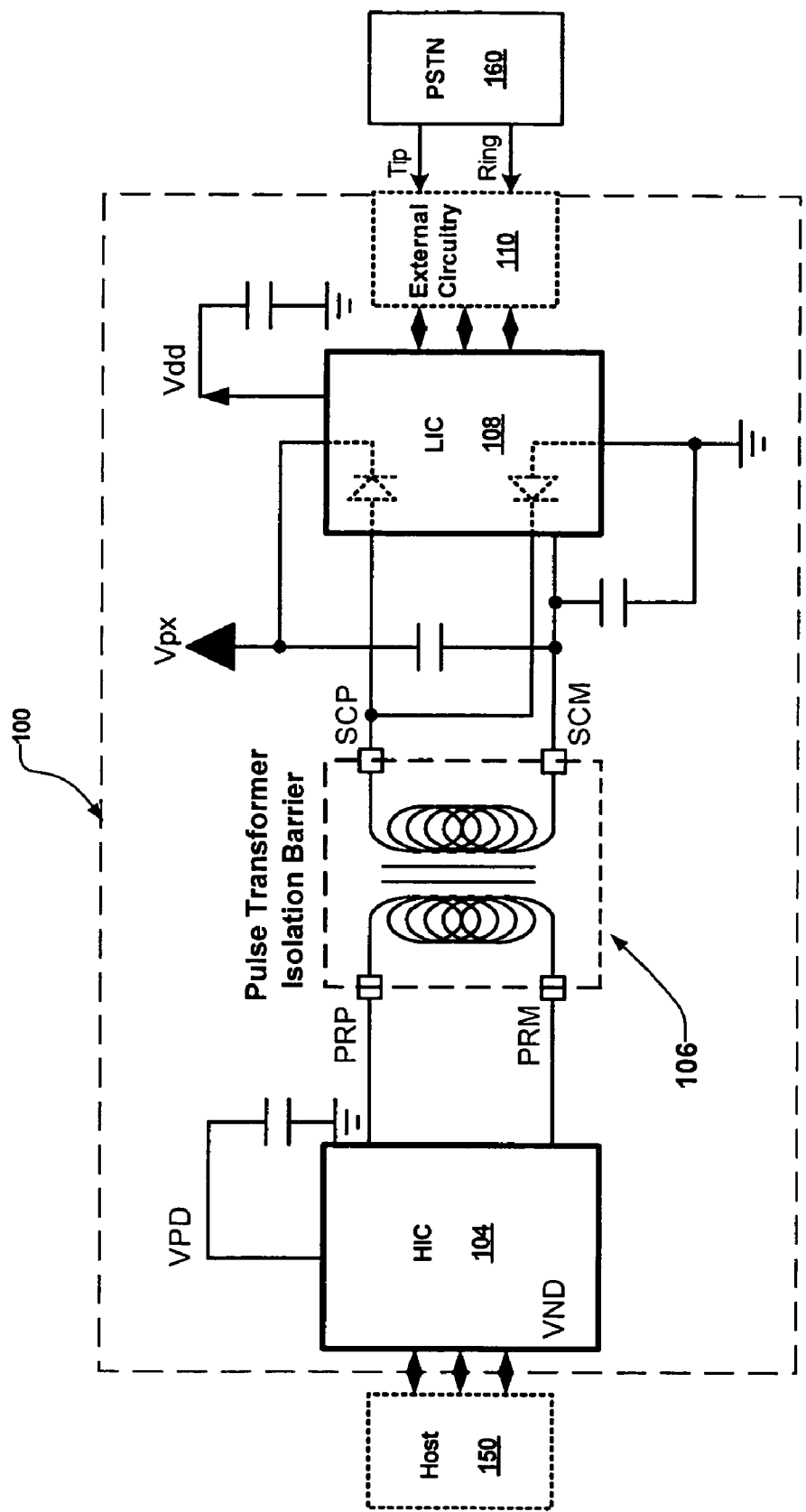
FIG. 1 is block diagram of a modem codec DAA (data access arrangement) connecting a host/DSP to a public switched telephone network in accordance with an embodiment of the present invention.

FIG. 1 is a block diagram of one embodiment of a modem DAA connecting a host/DSP to a PSTN. In this illustration, DAA 100 connects Host Computer 150 to PSTN 160 via the "tip" and "ring" lines of the telephone network. DAA 100 comprises Host Interface Component (HIC) 104; Isolation Barrier 106; Line Interface Component (LIC) 108; and external circuitry 110. HIC 104 interfaces the DAA functions with Host 150. Host 150 may include, for example, a DSP, personal computer, or similar device.

External circuitry 110 provides circuitry for connection of the DAA to PSTN 160. Typically, the PSTN signal is analog in nature. The analog information from the PSTN may be converted to digital information in LIC 108 before transmission across Isolation Barrier 106 to HIC 104. In one embodiment, Isolation Barrier 106 comprises a pulse transformer.

In telephony applications, analog voice band signals (e.g., 300 Hz—3.6 KHz) on the phone line may be converted to digital data in LIC 108 using modulation/demodulation techniques (e.g., at the rate of 1.536 Mbps for an 8 kHz sampling rate). The generated digital data may be further processed and/or directly time-division multiplexed with status and other information to form an effective transfer rate that may be higher than the bit rate of the digital data being sent across the transformer of Isolation Barrier 106. HIC 104 may subsequently demultiplex the received bit stream into the various components, e.g., voice band signal, status, and other information. HIC 104 may digitally filter the voice band signal, decimate and demodulate the voice band signal to extract the original voice band information, and then send the extracted digital voice band data (e.g., in 16-bit samples) to Host 150.

In the other direction (i.e., transmission from Host 150 to PSTN 160), HIC 104 may receive digital information from Host 150 for transmission to PSTN 160. HIC 104 may receive the digital information in the form of a digital data stream or other form (e.g., 16-bit data at 16 kHz) from Host 150 and may serialize it via a parallel-to-serial converter (or an appropriate modulation technique) to a bit stream of appropriate rate (such as, but not limited to, 256 kbps or 1.536 Mbps). In accordance with one or more embodiments of the invention, an encoding scheme may be used to maintain DC-balanced current and voltage characteristics within the signal driven across the transformer of Barrier 106, thus raising the actual data transfer rate across the barrier to the full transfer speed (such as, but not limited to, 512 kbps or 2.048 Mbps). The digital bit stream is then received by LIC 108.

Communication across Isolation Barrier 106 may be performed in full-duplex. In addition to the data communicated across the barrier, control and clocking information, as well as power may be sent across the barrier. For instance, clocking information used to reconstruct the HIC clock in LIC 108 may be embedded in the bit stream sent across the barrier from HIC 104.

In one embodiment of the DAA circuit, HIC 104 may provide power needed by LIC 108 while the phone line connection is "on-hook." However, after the phone line connection goes "off-hook," LIC 108 may be entirely line powered, if power is available from the telephone line.

A serial data port may be provided for transferring "receive" data and status information from HIC 104 to Host 150 and "transmit" data and control information from Host 150 to HIC 104. As used herein, "receive" data is data sent from the line side to the host side and "transmit" data is data sent from the host side to the line side.

In the descriptions that follow, the primary side of transformer 106 is connected to HIC 104 and the secondary side of transformer 106 is connected to the LIC 108 for consistency in description. It should be apparent to those of skill in the art that other arrangements are also possible. In addition, "forward direction" refers to data and control bits driven onto the primary by the HIC drivers. Clocking and power may also be provided in the forward direction. The "reverse direction" is data received by HIC 104 from across Barrier 106.

Pulse transformer 106 may have, for example, a 1:1 (PRI: SEC) winding ratio. However, it should be apparent to those of skill in the art that the transformer ratio is in no way constrained to those discussed herein.

The pulse transformer has advantages over other types of isolation elements. For instance, advantages of a pulse transformer over a capacitor as the isolation element include lower cost Bill of Materials (BOM); lower component count; and better common mode noise immunity. In addition, it may be easier to send power across a transformer with minimum loss (e.g., HIC 104 sending power across to LIC 108) while the phone line connection is "on-hook."

Figure 2:
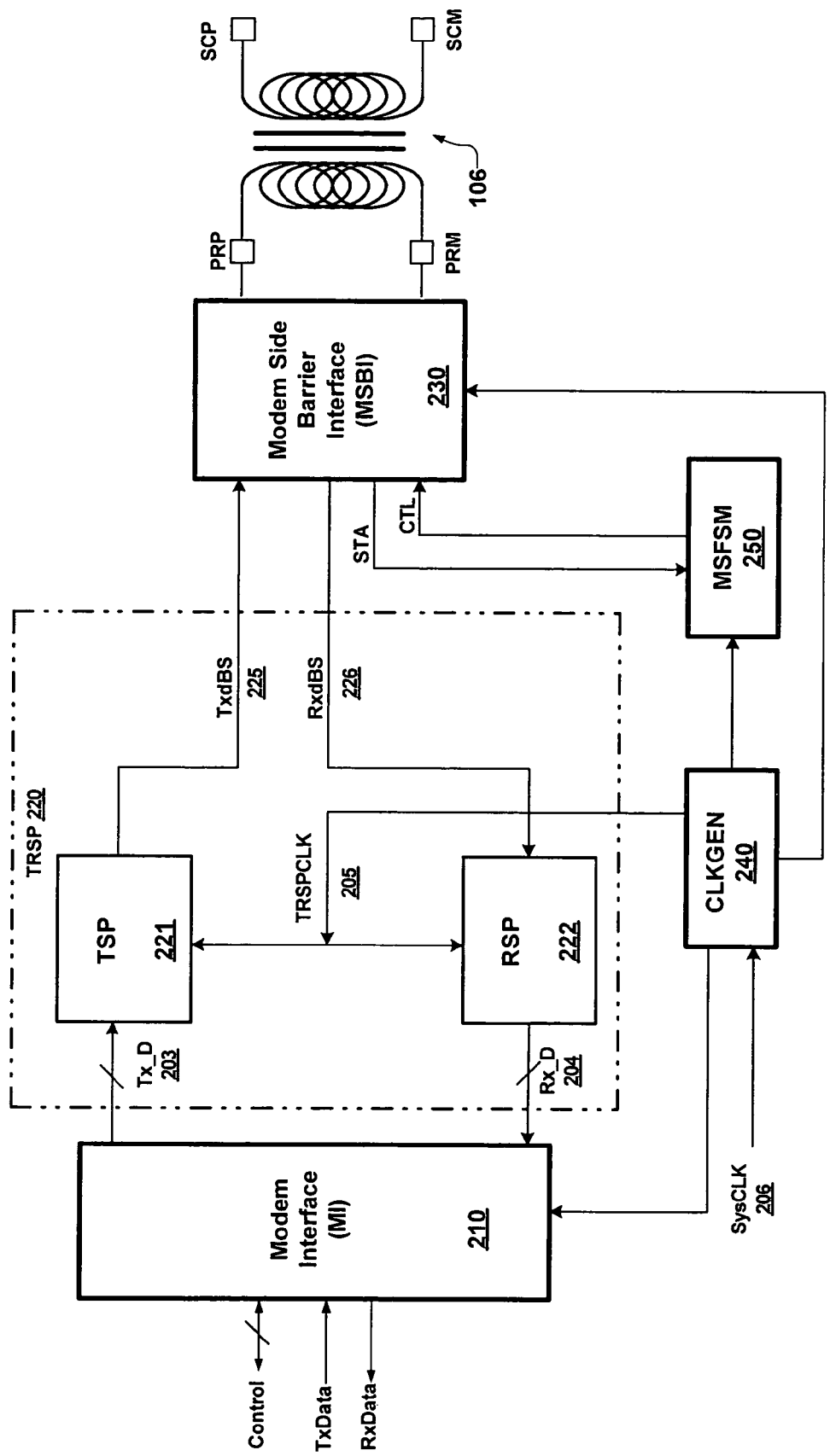
FIG. 2 is a block diagram of a host interface component in accordance with an embodiment of the present invention.

FIG. 2 is a block diagram of an embodiment of Host Interface Component 104. In the illustrated embodiment, HIC 104 may include, for example, Modem Interface (MI) 210; Transmit and Receive Signal Processors (TSP 221 and RSP 222); Modem Side Barrier Interface circuit (MSBI) 230; Modem Side Barrier Interface Finite State Machine (MSFSM) 250; and Clock Generation Circuit (CLKGEN) 240.

MI 210 may provide a bi-directional data port that can be configured to support most DSP's or similar processing units with which it may interface. MI 210 provides an interface between Host 150 and DAA 100. In the present illustration, only representative interface signals are shown.

Signals $Tx_{13}D$ 203 and $Rx_{13}D$ 204 may be configured as internal signals of a predetermined width (e.g., 16 bits wide). In this illustration, $Tx_{13}D$ 203 is input to Transmit Signal Processor (TSP) module 221 and $Rx_{13}D$ 204 is output from Receive Signal Processor (RSP) 222. In addition, clock signals TRSPCLK 205 provides clocking for module TSP 221 and module RSP 222. In addition, clocks to MSFSM 250 and MSBI 230 may be derived within CLKGEN 240 from the system clock (SysCLK 206).

TSP 221 receives digital data, $Tx_{13}D$ 203, from MI 210, processes the digital data, and may serialize it via a simple parallel to serial converter or through an over-sampling quantizer (e.g., digital sigma-delta modulator) to generate transmit bit stream TxdBS 225, which is coupled to MSBI 230 for transmission over the barrier. The present invention is in no way limited in the mechanism by which the one-bit data stream TxdBS originates.

In one or more embodiments, TSP 221 may consist of a transmit interpolation filter (TIF) that takes in 16-bit data, for example, from MI 210 at a certain rate (e.g., 8 kHz), and a parallel to serial converter or a digital sigma-delta modulator. The TIF may up-sample (i.e., interpolate) the data to a desired rate (e.g., 16 kHz), and output a 16-bit (or other multi-bit) data stream. This 16-bit data stream may be immediately serialized and sent to MSBI 230 for transmission or, alternately fed to a digital sigma-delta modulator and thus converted to a serialized bit stream for transmission. The former has the advantage of reduced data rate across the barrier; however, any serialization method may be employed without departing from the spirit of the invention.

The serialized output TxdBS 225 from either the parallel to serial converter or a digital sigma-delta modulator (DSDM) is fed into MSBI 230 for time-division multiplexing with control data to form a transmit bit stream (TBS), which, in one or more embodiments, is double-balanced encoded (e.g., DC-balanced with respect to current and voltage drive to the transformer) prior to transmission across the barrier to LIC 108.

In the receive direction, information that is transferred over the barrier (e.g., using impedance modulation) from the LIC 108 to MSBI 230 is decoded and separated into data and status in MSBI 230. The data portion (RxdBS 226) may be fed to one or more digital filters in RSP 222. The digital filters may be synchronized so that there is one sample available at the desired output rate (e.g., 16 kHz).

The output of RSP 222, $Rx_{13}D$ 204, may be decimated output data (e.g. 16-bit wide) at the desired rate (e.g., 8 kHz). $Rx_{13}D$ 204 may then be transmitted to MI 210 for subsequent processing and transmission to Host 150.

MSBI 230 provides the interface functionality of the HIC with the isolation barrier for communication with LIC 108. In one or more embodiments, in addition to other functions, the MSBI 230 may manage all of the required signaling across the barrier by, for example: encoding the transmit bit stream (TxdBS 225) and control information (CTL) and transferring the encoded signal across the barrier; decoding the receive bit stream (RxdBS 226) and status information(STA) from LIC 108; and generating proper amplitude pulses to transfer power to LIC 108 when necessary. The MSFSM 250 is a state machine that controls the functions of MSBI 230 and generates the control signal, CTL, that is transferred across the barrier to LIC 108.

Figure 9:
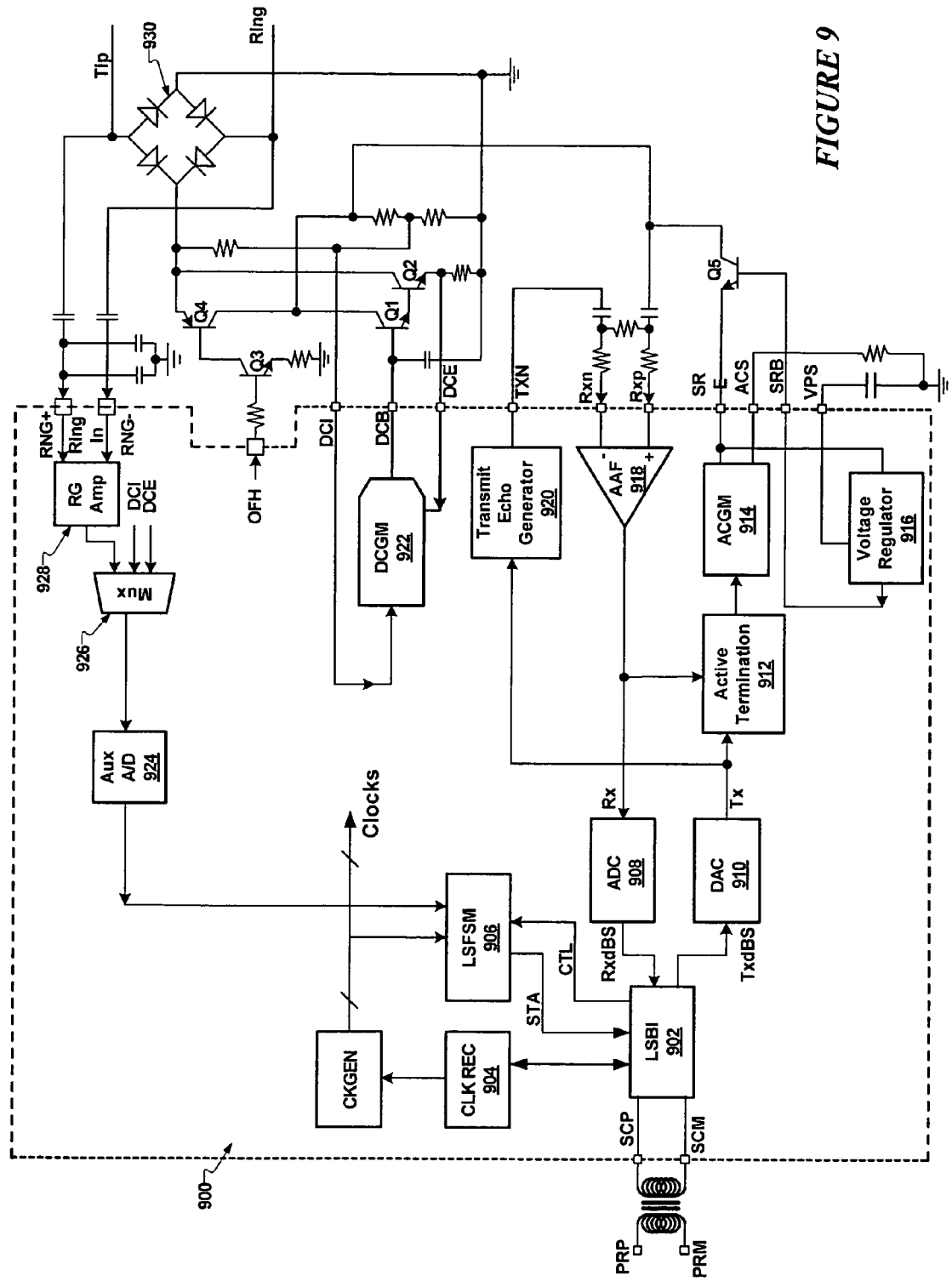
FIG. 9 is a block diagram of a line interface component in accordance with an embodiment of the present invention.

Referring back to FIG. 1, the telephone line side of the DAA embodiment comprises LIC 108 and external circuitry 110. The functionality of LIC 108 and external circuitry 110 of one possible embodiment are further illustrated in FIG. 9. As illustrated, LIC 108 comprises circuitry enclosed in block 900. Other circuitry (not shown) may also be part of the external circuitry 110.

LIC 108 comprises Line Side Barrier Interface (LSBI) 902; Clock Recovery circuit (CLK REC) 904; Line Side Finite State Machine (LSFSM) 906; Analog-to-Digital Converter block (ADC) 908; Digital-to-Analog Converter block (DAC)

910; Active Termination circuit 912; AC Transmit Driver (ACGM) 914; Voltage Regulator 916; Anti-Aliasing Filter (AAF) 918; Transmit Echo Generator 920; DC Termination Circuit (DCGM) 922; Auxiliary Analog-to-Digital Converter (Aux A/D) 924; Multiplexer 926; and Ring Amplifier (RG Amp) 928.

In one embodiment, the analog signal from the telephone line (Tip and Ring) is conditioned through Rectifier 930 to eliminate any polarity issues. The positive terminal of Rectifier 930 is AC coupled through the Rxp input of block 900 to the positive terminal of AAF 918. As illustrated, AAF 918 may comprise one or more active and/or passive filters and amplifiers. The negative terminal, Rxn, of AAF 918 is AC coupled to output TXN of Transmit Echo Generator 920 for transmit echo cancellation. AAF 918 sums the receive signal, Rxp, with a portion of transmit signal, TXN, to reduce the transmit signal component in the receive path.

The analog output, Rx, of AAF 918 is coupled to ADC 908 for conversion to the receive data bit stream, RxdBS. The resulting high frequency one-bit receive data stream (RxdBS) may be sent to LSBI 902 for encoding and eventual transmission across the barrier to HIC 104, or alternately be further filtered by an additional digital filter such as Sinc03 filter, then serialized and sent to LSBI 902 for transmission across the barrier.

DCGM 922 provides for appropriate DC termination characteristics by monitoring the input voltage from the telephone line (DCI), and the DC loop current sense (DCE).

On the transmit side, the transmit bit stream (TBS) received from across the barrier by LSBI 902 is first separated into transmit data bit stream (TxdBS) and control data (CTL). TxdBS is processed through Digital-to-Analog Converter block (DAC) 910 to generate the analog transmit signal Tx. The received signal from AAF 918 (e.g., Rx) is summed with the transmit signal in Active Termination block 912. AC termination is provided by sensing the receive signal at Rxp and feeding back an appropriate AC current generated within Active Termination Circuit 912 via AC Transmit Driver 914 to the collector of transistor Q5.

In one or more embodiments, an auxiliary analog to digital converter, Aux A/D 924, may be used to convey status information associated with the line condition. The tip and ring inputs may be coupled as differential inputs to amplifier 928, and then multiplexed with the line sensing signals, DCI and DCE, for conversion in Aux A/D 924. The output of Aux A/D 924 may then be coupled to Line Side Finite State Machine (LSFSM) 906 for transmission to HIC 104 as a status (STA) component of the receive signal. The host (i.e., Host 150) in communication with HIC 104 receives and interprets the status data to decide the appropriate action in controlling the DAA device.

Full-Duplex Signaling Over the Transformer

To understand the functions of MSBI 230 and LSBI 902, it is useful to discuss the general concept of transferring data bi-directionally and simultaneously (i.e., full duplex) across the isolation barrier in accordance with one or more embodiments of the present invention.

Figure 3A:
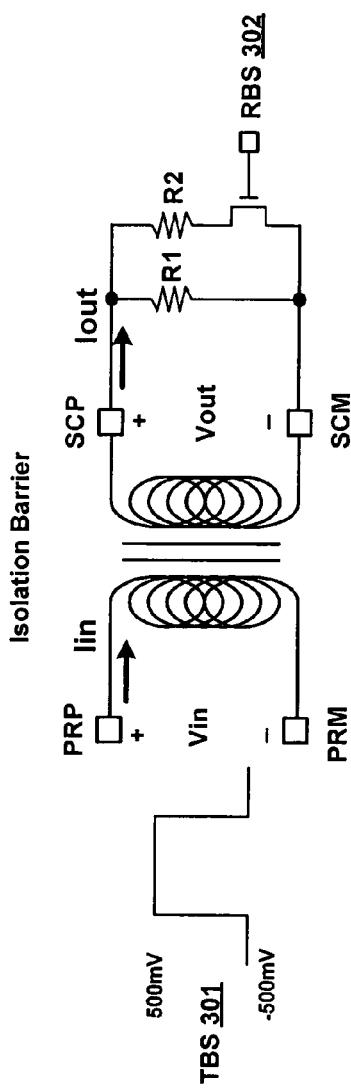
FIG. 3A is a circuit diagram of a transformer drive scheme in accordance with an embodiment of the present invention.
Figure 3B:
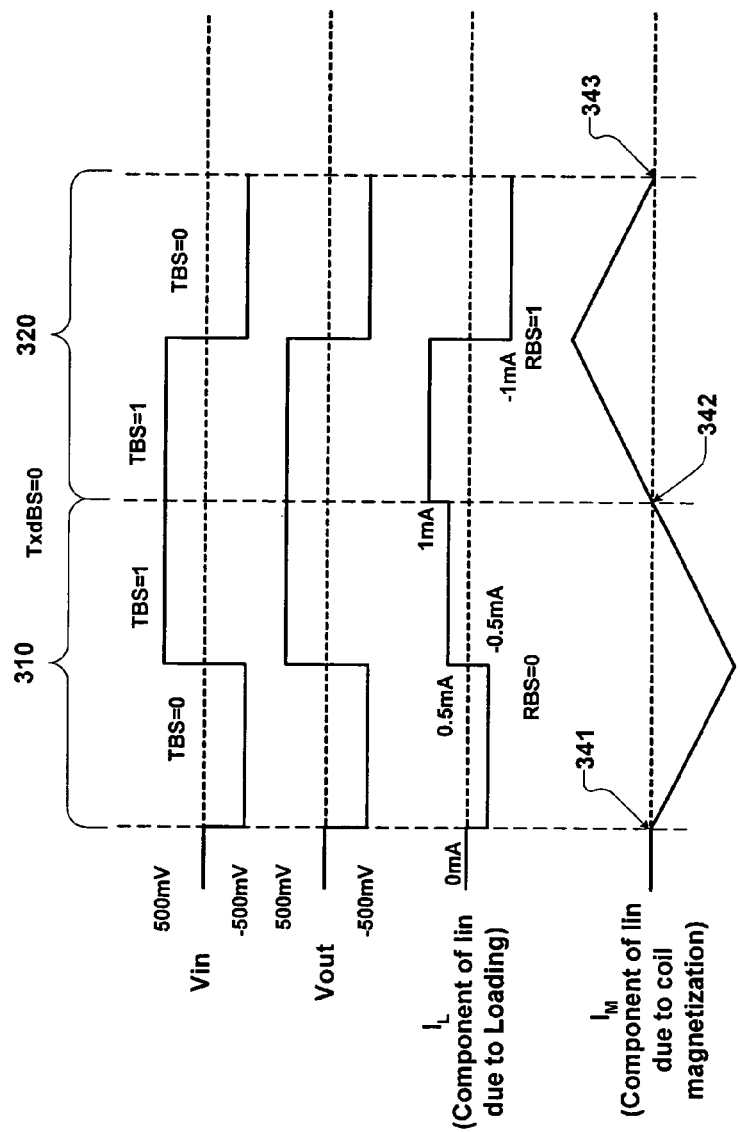
FIG. 3B is a signal diagram of the circuit of FIG. 3A, in accordance with an embodiment of the present invention.

FIGS. 3A and 3B provide illustration of the basic concept involved in the bi-directional transfer of data across a pulse transformer. FIG. 3A is an illustration of a transformer drive scheme in accordance with an embodiment of the present invention. FIG. 3B shows the transformer voltage and current values Vin, Vout, and Iin when the input data TxdBS="0" is doubly DC balanced via Manchester coding to yield "0110" TBS (first stage Manchester encoding: "0" becomes "01"; second stage Manchester encoding: "01" becomes "0110") and the receive data RBS transitions from "0" to "1" at the midpoint of the data period. In this illustration, PRP and PRM are the positive and negative terminals on the primary side of the pulse transformer, respectively. Similarly, SCP and SCM are the positive and negative terminals on the secondary side of the pulse transformer, respectively.

In operation, transmit data, in the form of input voltage Vin, is driven across the primary side of the transformer. Assuming a 1:1 winding ratio (though other winding ratios may be used as well), mutual inductance causes the input voltage to be induced across the output terminals of the secondary as Vout. As a consequence, output current Iout flows through the loading resistor R1 (e.g., 1 k•), assuming the switch on R2 is open (i.e., off). Since magnetic flux in a transformer cannot change immediately, input current Iin will flow into the primary side simultaneously.

By turning on the switch controlled by RBS 302 (see portion of waveforms in FIG. 3B labeled 320), and hence placing resistor R2 in parallel with resistor R1, the load impedance changes to the equivalent impedance of two resistors in parallel. For example, if R1 and R2 are each 1 k$\Omega$, then the equivalent impedance is 0.5 k$\Omega$. Load-dependent components of Iout and Iin also change as the impedance changes. For instance, if the load current, $I_L$, is 0.5 milliamps when driven by +0.5 v across the primary ports with only R1 as the load impedance, then the load current will double to 1.0 milliamps when R2 is switched on (given R1=R2=1 k$\Omega$). Thus, if the load-dependent portion of Iin could be separated out from the total current Iin, it would form a basis for detecting the impedance changes on the primary side of the barrier and extracting the receive data (RBS 302) responsible for those changes (i.e., by controlling the switch).

In operation, Iin is composed of a magnetizing inductance component and a load current component. For the detection of impedance modulation, it is possible to isolate the component of Iin due to load impedance, $I_L$, from the component of Iin due to the magnetizing inductance, $I_M$. One or more embodiments of the invention facilitate isolation of the loading current from the magnetizing current by using a transmit data encoding scheme that is double DC balanced, i.e., DC balanced in both current and voltage. Double DC-balancing of the transmission signal induces predictable behavior in the magnetizing inductance current, such that the magnetizing inductance current is near zero at specific times. For example, in FIG. 3B, $I_M$ approaches zero value at points 341, 342 and 343 (e.g., at the end of each double-balanced data period).

Figure 4:
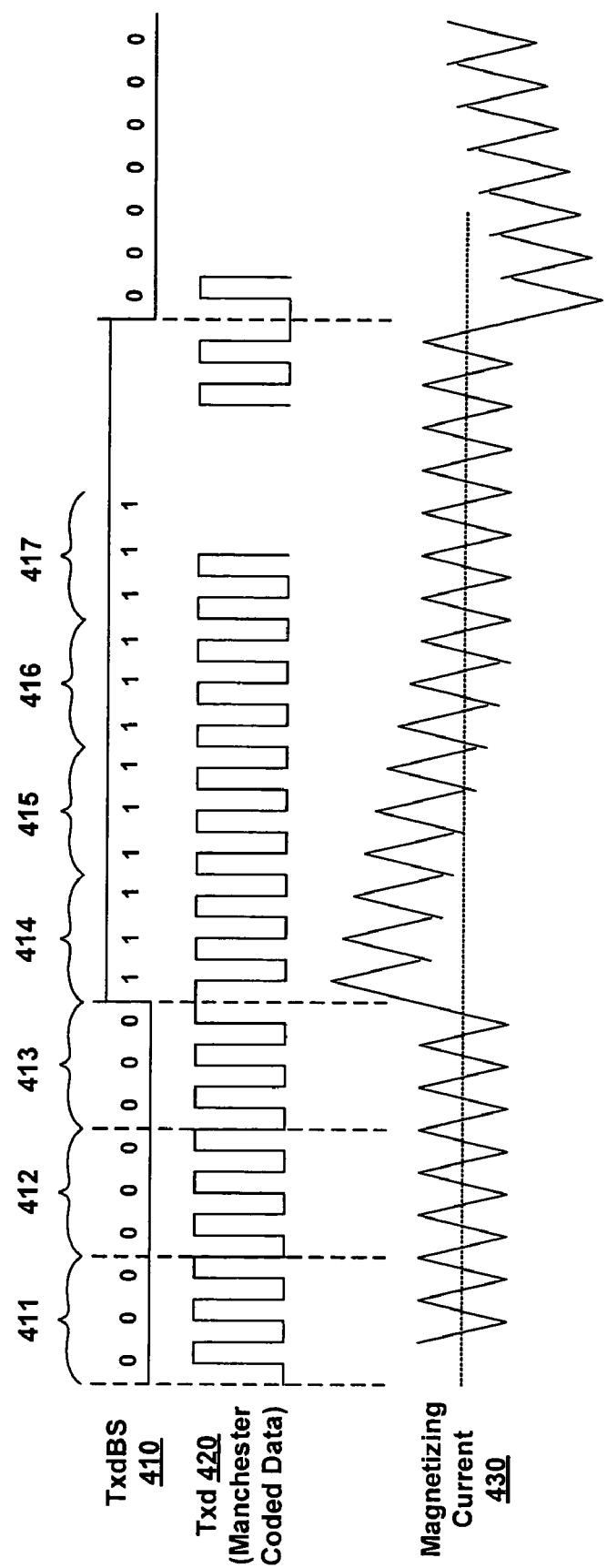
FIG. 4 is a signal diagram illustrating the effect of a single-balanced data signal (e.g., by 1-bit to 2-bit Manchester encoder) on magnetizing current.

FIG. 4 provides an example of a transmit data stream that is not double-balanced, with the corresponding magnetizing current. In this example, transmit data TxdBS 410 is Manchester encoded (single balanced) to generate coded data Txd 420, which is driven across a transformer. In this illustration, the magnetizing current 430 at the end of each of the Manchester periods is affected by the change in data pattern and may vary from one Manchester period to the next as shown. For example, at the transition from data sequence 413 to data sequence 414, the magnetizing current, because of its integrating behavior, rises well above the DC balance point for current. The perturbation in DC current value decays toward zero over time until perturbed again by another non-double-balanced data sequence. This makes the process of isolating the load current from magnetizing current more difficult because the value of the magnetizing current is unpredictable.

To make magnetizing current predictable, the transmit signal may be doubly DC balanced prior to transmission across the transformer. Balancing the transmit data signal in both current and voltage may be established, for example, by applying multiple single-balanced encoding processes to the transmit data (in sequence or otherwise). For example, Manchester encoding (i.e., 1 b/2 b) applied twice to the transmit signal will result in a double-balanced data stream. In other embodiments, a single encoding process may be implemented that provides DC balancing of both current and voltage characteristics. The benefit of this encoding is that the magnetizing current, $I_M$, returns to zero at the end of every Manchester period.

In accordance with one embodiment of the invention, this facilitates detection of the load current, $I_L$, by sampling Iin at specific points in time when $I_M$ is near zero (e.g., near the transition between each Manchester period).

In accordance with another embodiment of the invention, the predictable nature of magnetizing current $I_M$ allows for generation of a corresponding cancellation current at the primary of the transformer, such that the load-dependent current $I_L$ may be sampled substantially free of the influence of the magnetizing inductance current.

The impact of specific balancing block codes on transmission bandwidth, circuit complexity, and decay time of the encoded signal may be considered in selecting a particular encoding scheme. For instance, using two Manchester encoders (1-bit to 2-bit encoding) in series would result in the use of four times the original transmission bandwidth. In contrast, using a 7 b/8 b (i.e., 7-bit to 8-bit) encoder would be more bandwidth efficient, but may result in an unnecessarily complex circuit. In one or more embodiments of the present invention, a DC balanced 3 b/4 b encoder or a Manchester encoder is applied in series with another Manchester encoder to provide predictable magnetizing current with relatively moderate increases in bandwidth.

Figure 5A:
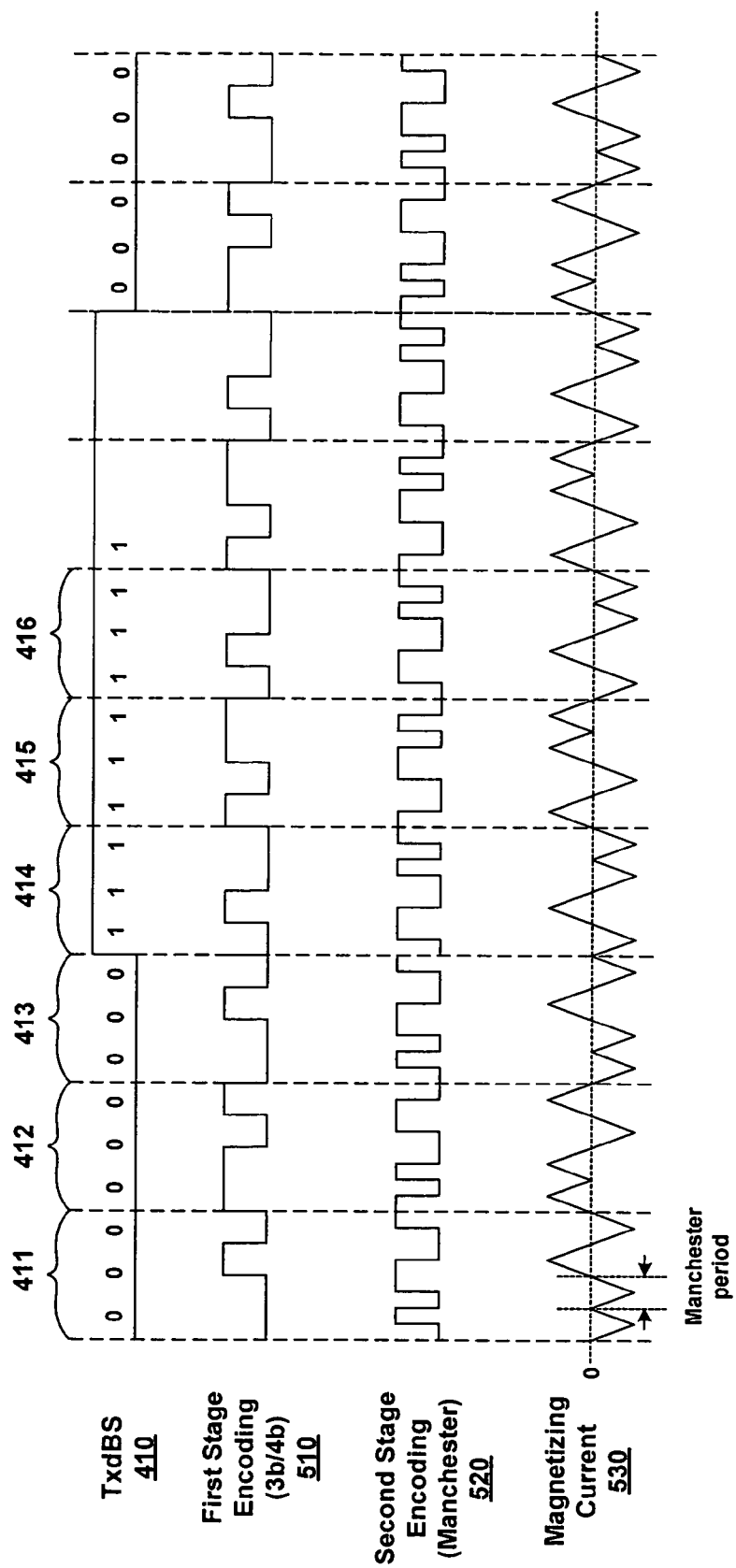
FIG. 5A is a signal diagram illustrating the behavior of the magnetizing current after transmit data is first processed through a 3-bit to 4-bit encoder followed by a Manchester encoder in accordance with an embodiment of the present invention.

FIG. 5A is an illustration of the behavior of the magnetizing current after TxdBS 410 is processed through a 3-bit to 4-bit encoder in accordance with an embodiment of the present invention. In this illustration, a DC-balanced 3-bit to 4-bit encoding scheme is used in the first stage (i.e., waveform 510), followed by a Manchester encoding second stage (i.e., waveform 520). This combination of encoding schemes results in the magnetizing current shown in waveform 530, which returns to zero at the end of each Manchester period.

A 4-bit data scheme has only six code words available that are DC balanced as follows: "0011"; "0101"; "0110"; "1001"; "1010"; and "1100". Thus, in the 3-bit to 4-bit encoding scheme of an embodiment of the present invention, these six balanced code words are assigned the values from one ("001") through six ("110") of the three input bit combinations. The remaining two input words, zero ("000") and seven ("111") are encoded to alternate between two unbalanced 4 bit words that average to DC-balanced words, e.g., "000" may be encoded to alternate between "0010" and "1101", while "111" may be encoded to alternate between "0100" and "1011".

Figure 5B:
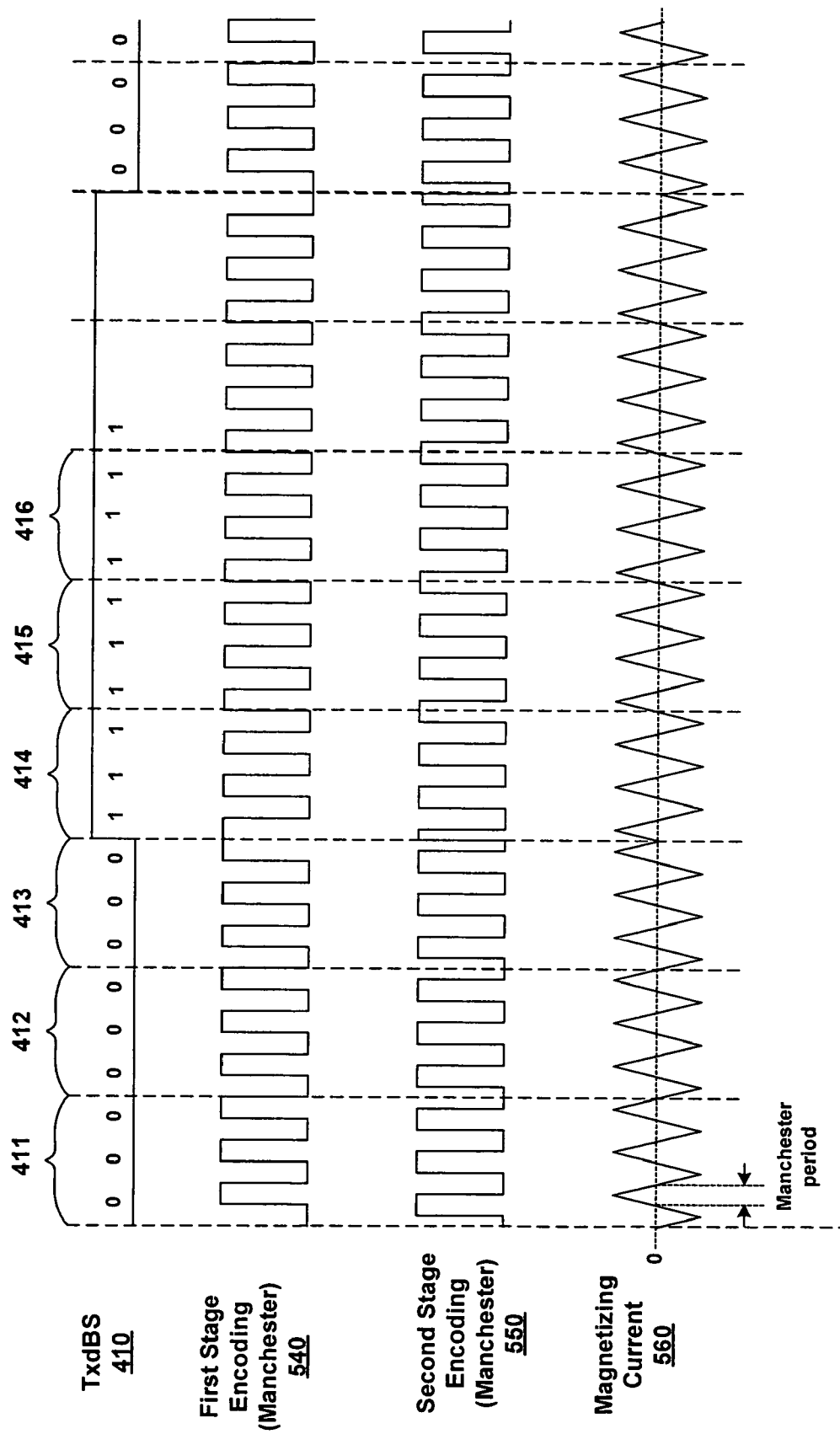
FIG. 5B is a signal diagram illustrating the behavior of the magnetizing current after transmit data is first processed through a first Manchester encoder (1 b/2 b) followed by a second Manchester encoder in accordance with an embodiment of the present invention.

FIG. 5B is an illustration of the behavior of the magnetizing current in another embodiment after TxdBS 410 is processed through two layers of Manchester encoding. In this illustration, a DC-balanced 1-bit to 2-bit encoding scheme is used in the first stage (see waveform 540), followed by a Manchester second stage (see waveform 550). As in the 3 b/4 b case, the magnetizing current is predictably zero at the end of each Manchester period independent of the raw transmit data values, as shown in waveform 560.

As waveform 530 illustrates, the encoding of each three-bit group (411, 412, 413, 414, 415, and 416) of transmit data to a DC balanced four bits results in a balanced and predictable magnetizing current 530—i.e., zero at the end of each Manchester period. Thus, the transformer input current Iin sampled at the end of every Manchester period will ideally be equal to $I_L$, the load current. Because load current can be detected by sampling the primary side current, Iin, at prescribed times, it is possible, in one or more embodiments of the invention, to communicate receive data using modulation of load impedance on the secondary of the transformer.

Modem Side Barrier Interface

Figure 6:
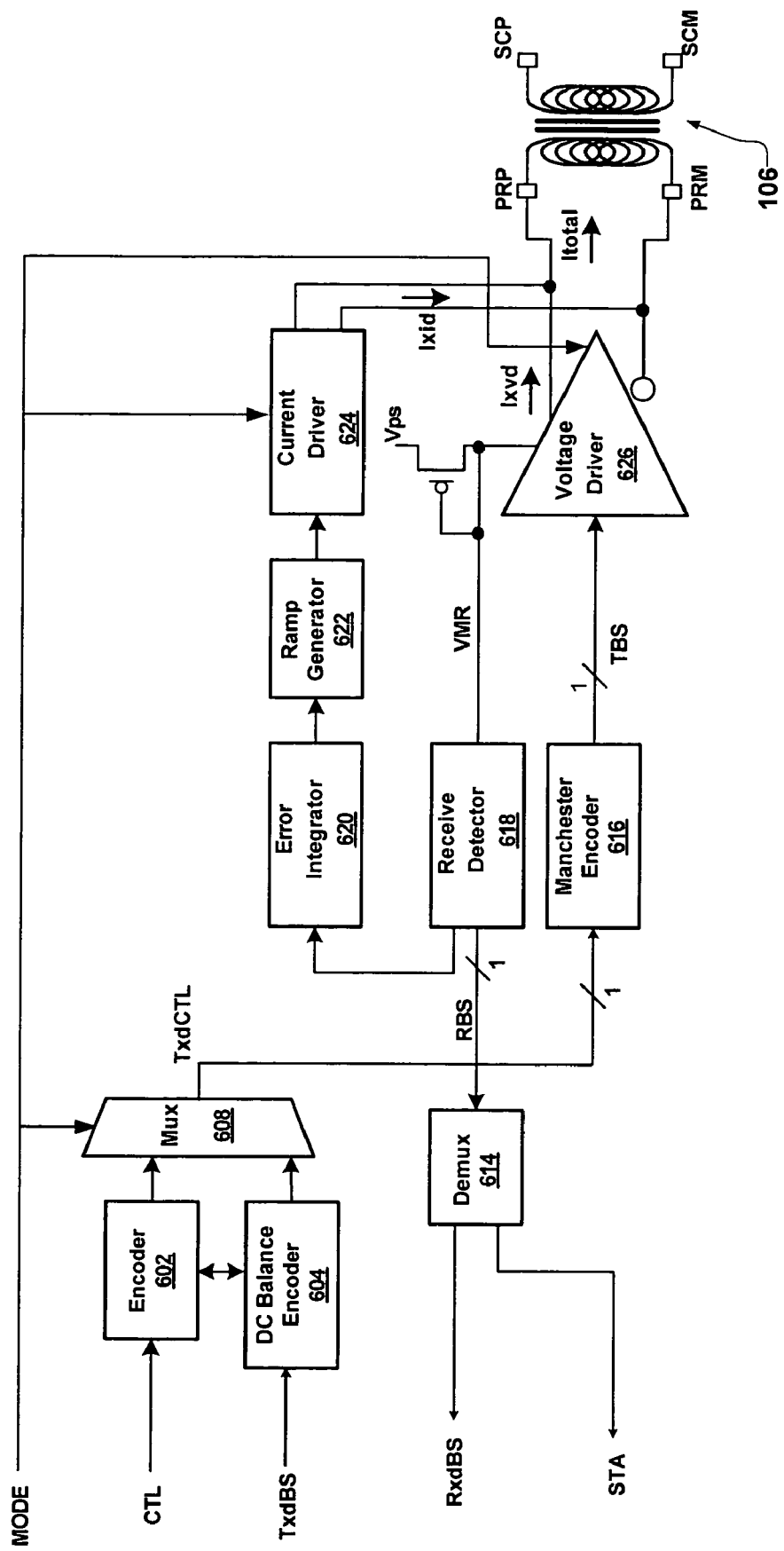
FIG. 6 is block diagram of a host-side barrier interface in accordance with an embodiment of the present invention.

Now referring back to MSBI 230 of the DAA circuit example, FIG. 6 illustrates one embodiment of a Modem Side Barrier Interface. As shown, MSBI 230 may comprise Control Encoder block 602; DC Balance Encoder block (e.g., 3 b/4 b, Manchester, etc.) 604; Multiplexer (Mux) 608; Demultiplexer (Demux) 614; Manchester Encoder 616; Receive Detector 618; Error Integrator 620; Ramp generator 622; Current Driver 624; and Voltage Driver 626.

In this example, transmit data, TxdBS, is first DC-balance encoded (e.g. by either 3b/4b encoding and then serializing, or directly serializing via Manchester encoder) at block 604. Encoding increases the rate of the transmit data. For example, assuming the data rate of the transmit bit stream, TxdBS, is at 256 kbps, the actual data rate across the barrier, after two layers of Manchester encoding, is 256×4=1.024 Mbps, or after 3-bit to 4-bit conversion in series with Manchester encoding, 256×4/3×2=683 kbps.

In one embodiment, an AC power signal may be transmitted over the isolation barrier to LIC 108 from HIC 104 in special power frames that are time division multiplexed with data frames carrying the TxdBS data stream. The power frame may consist of, for example, enhanced magnitude voltage pulses that may be rectified and converted to a DC power source on the line side of the barrier. The power signal is doubly DC balanced at the point it is driven across the transformer, and, in one or more embodiments, may be utilized as a channel for control information.

In the embodiment of FIG. 6, composite signal CTL is the power signal modulated by control data. For example, when transfer of control data is necessary, the control data bit (i.e., CTL) may be encoded as follows: "0" may be encoded as "xx0101xx" and "1" may be encoded as "xx1010xx" in block 602 (where "xx" represents "don't care" bit values that are allowed to vary as long as double DC balancing is maintained). The resulting encoded CTL data and TxdBS data are time-division multiplexed in Mux 608 to generate TxdCTL, which is subsequently Manchester encoded in block 616 to generate the transmit bit stream, TBS. Transmit bit stream TBS is driven across the barrier by Voltage Driver 626.

Figure 7A:
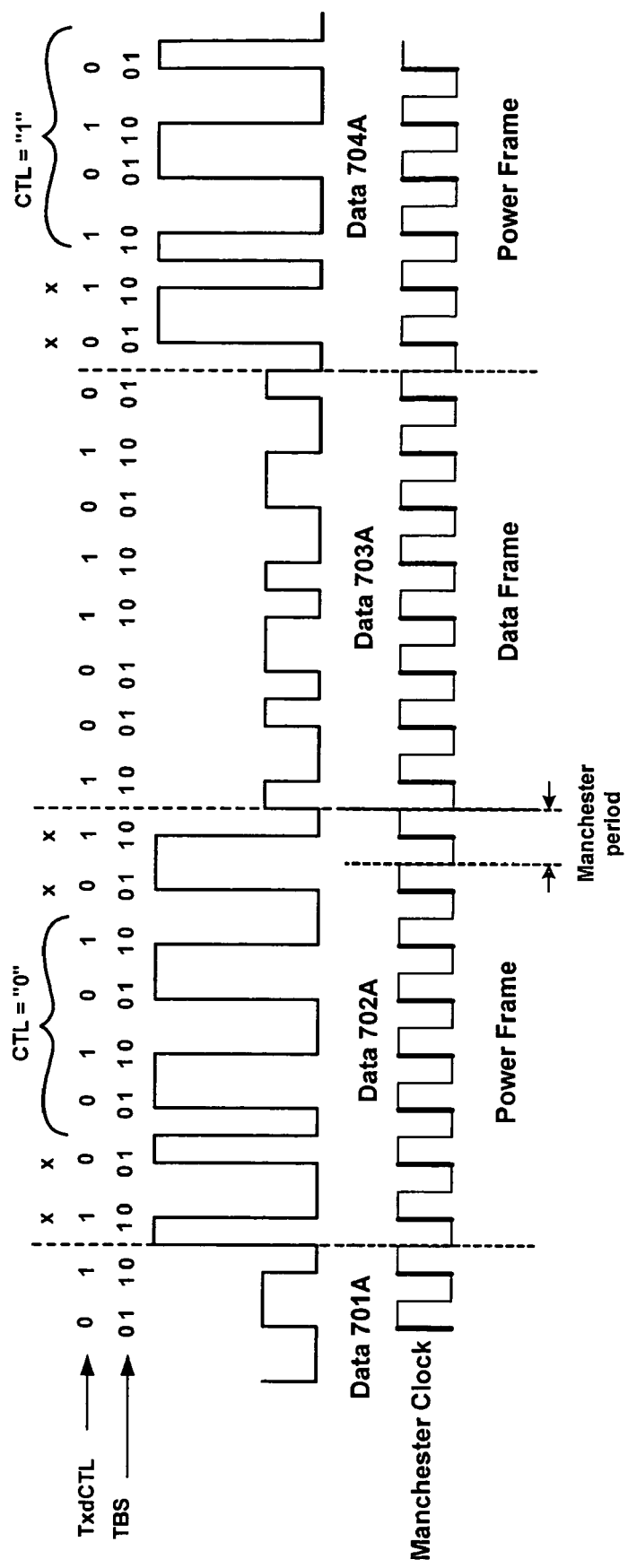
FIG. 7A is a signal diagram illustrating encoding of control and data in accordance with an embodiment of the present invention.

FIG. 7A is an illustration of encoding control and transmit data as seen across the primary side of the barrier in accordance with an embodiment of the present invention. It consists of power frames (702A and 704A) and data frames (701A and 703A). In the illustrated embodiment, each frame consists of eight Manchester periods. Each frame is thus capable of transferring four bits of raw data or eight bits of DC-balanced data (as a result of 1 b/2 b Manchester encoder or a 3 b/4 b encoder), prior to Manchester Encoder 616.

Control signal, CTL, may be time-division-multiplexed with the transmit bit stream (TxdBS) for transmission across the barrier to LIC 108 from the HIC 104. In a preferred embodiment, each power frame is assigned one value of CTL bit as shown in FIG. 7A. In block 602, CTL="0" may be encoded as "xx0101xx" and CTL="1" may be encoded as "xx1010xx". It should be clear to those skilled in the art that more than a single bit of CTL information may be transferred across in one power frame. The resulting encoded CTL data and TxdBS data are time-division multiplexed in Mux 608 to form the composite bit stream, TxdCTL, which is subsequently Manchester encoded in block 616 before being driven across the barrier by Voltage Driver 626. As illustrated, Data 701A represents data to be transmitted; Data 702A represents a control value of "0"; Data 703A represents data to be transmitted; and Data 704A represents a control value of "1".

As illustrated in FIG. 7A, for an embodiment using a 3 b/4 b encoder, one bit of control data and six raw (uncoded) transmit bits (equivalent to eight coded bits) are alternately transferred across the barrier, the effective control data transfer rate is one-sixth the rate of the transmit bit rate. In another embodiment wherein the first stage encoder is a 1 b/2 b encoder, one bit of control data and four raw (uncoded) transmit bits (equivalent to eight coded bits) are alternately transferred across the barrier, the effective control data transfer rate is one-fourth the rate of the transmit bit rate.

Figure 7B:
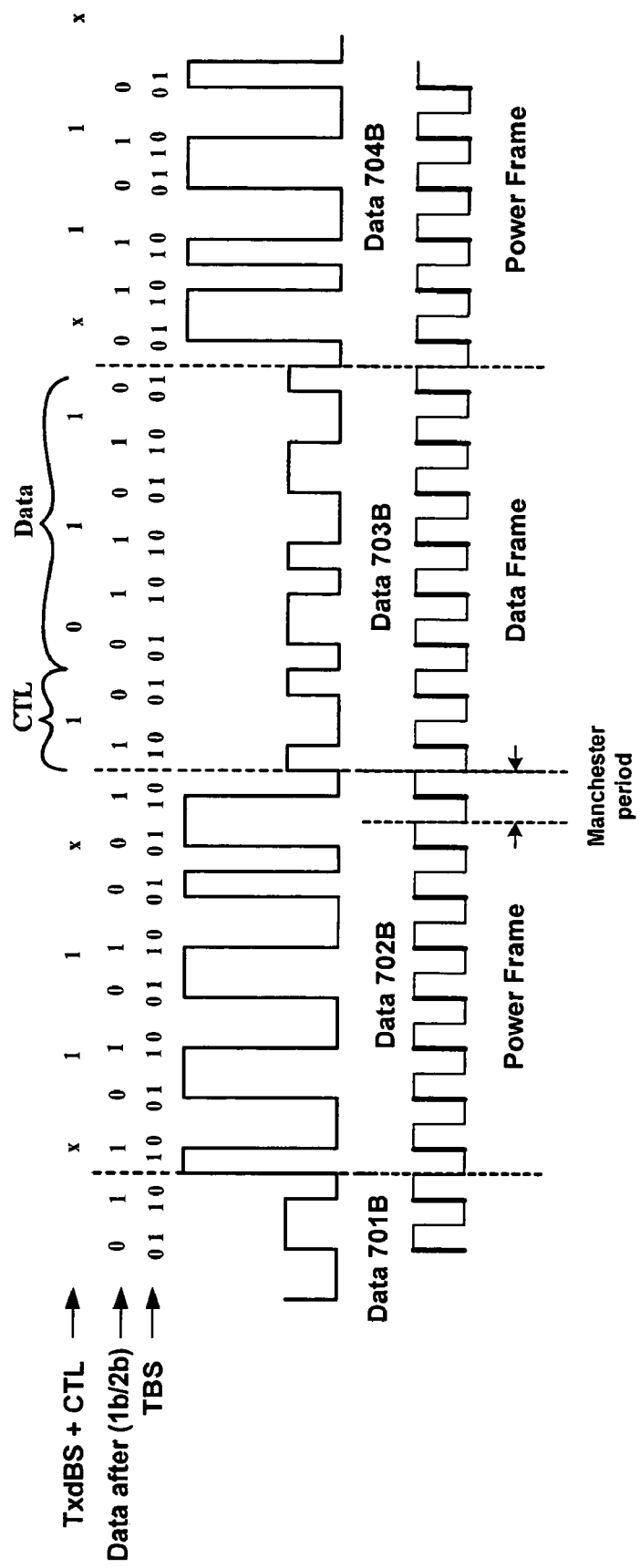
FIG. 7B is a signal diagram illustrating encoding of control and data in accordance with another embodiment of the present invention.

Alternately, FIG. 7B shows that CTL information can be embedded in the Data frame itself instead of the power frames if excess bandwidth exists within the data frames. In this embodiment, 1 b/2 b encoder as the first layer of encoding is used in which one bit of control data and three (uncoded) bits are alternately transferred across the barrier. The effective control data transfer rate is one third the rate of the transmit bit rate.

Cancellation of Magnetizing Inductance Current

Referring back to FIG. 6, the receive data, RBS, may be decoded by isolating the transformer current, Itotal, into two components: $I_M$, the magnetizing current; and $I_L$, the load current (i.e., due to the transformer load impedance of R1 and R2). In accordance with an embodiment of the invention, a current feedback path comprising elements 618, 620, 622 and 624 may be implemented to generate a compensating current Ixid, which acts to cancel the magnetizing inductance current, $I_M$. The feedback loop forces Ixid to track $I_M$ so that the receive data may be detected and extracted from the load current $I_L$, which in this embodiment is sourced from (or sunk by) the voltage driver as input current Ixvd (i.e., if Ixid is substantially equivalent to $I_M$, then Ixvd will consist substantially of $I_L$).

Figure 8:
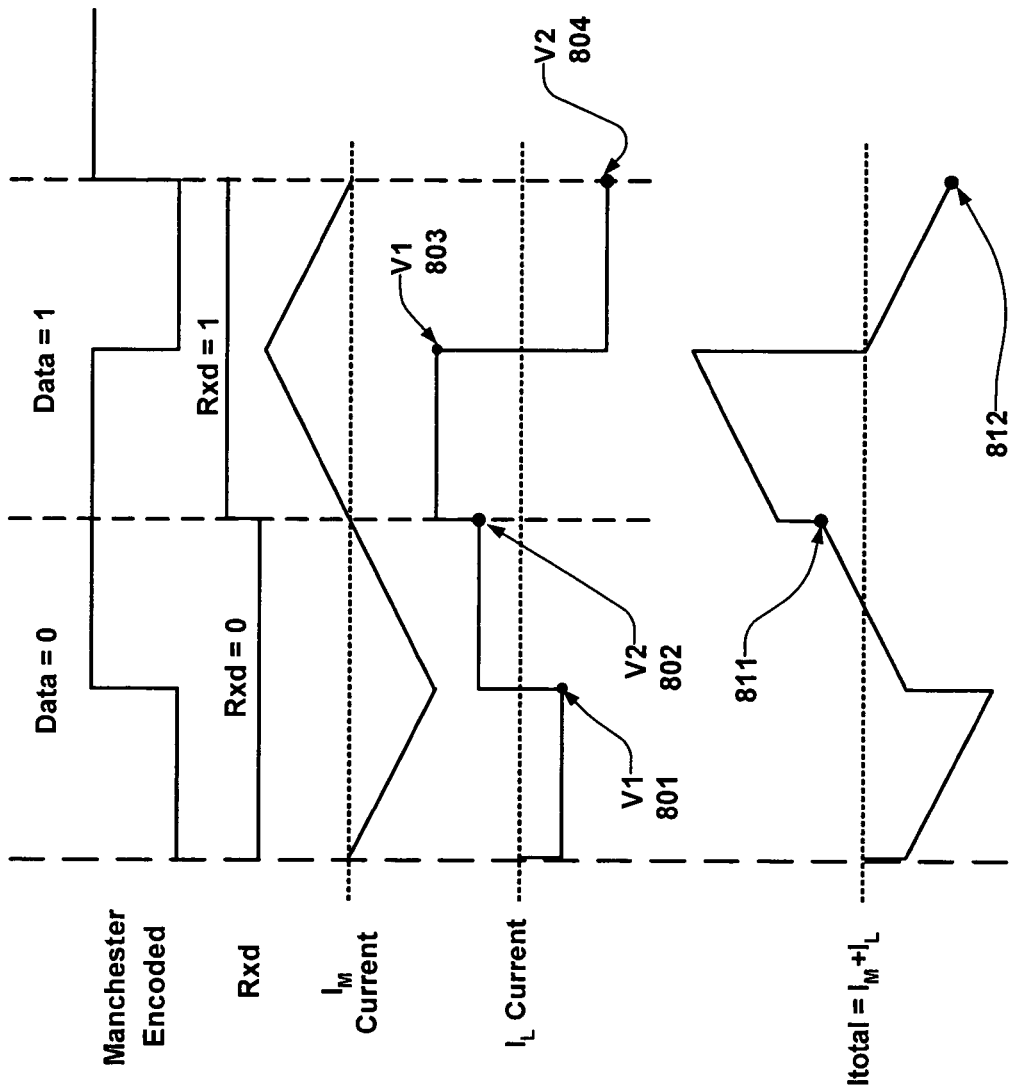
FIG. 8 is a signal diagram illustrating an example of transformer current waveforms associated with transmit and receive data signals, in accordance with an embodiment of the present invention.

The digital input voltage signal comprises short spans of relatively constant voltage values, balanced around zero. Due to the integral relationship between input voltage and current in an inductor, the magnetizing inductance current, as illustrated in FIG. 8, may be characterized as a fixed-rate ramp toggling between upward and downward slopes as the input voltage signal toggles between digital (e.g., binary) voltage states. A compensating current equivalent to the magnetizing current may therefore be generated by a controllable current ramp generator.

In one embodiment, a high speed ramp current is generated in block 622, and scaled and converted to Ixid in current driver block 624. The generated current, Ixid, feeds into the primary terminal of the transformer to cancel the magnetizing inductance current drawn by the transformer. Due to the operation of the feedback loop, current Ixid is adapted to be substantially equivalent to the magnetizing current, $I_M$, so that the current (Ixvd) sourced (or sunk) by voltage generator 626 is substantially equivalent to the isolated load current, $I_L$.

As illustrated, Receive Detector 618 decodes the receive data and generates the loop error discriminant from signal VMR. Signal VMR, in one embodiment, is a voltage signal that is generated by forcing the rectified value of current Ixvd (i.e., |Ixvd|) of the voltage driver thru a diode connected PMOS device. VMR can then be conveniently used in a current mirror configuration to regenerate error current within Error Integrator 620 for further processing.

The receive detector may comprise a load current processing circuit and a threshold detector, for example. Thus, an embodiment may use a simple logic of setting the receive data to zero ("0") when the load current is below the known threshold, otherwise the receive data is set to one ("1"). Alternately, the receive data may be differentially encoded such that the data may be detected by detecting the load currents differentially. Preferably, the ratio of the magnetizing inductance over the voltage driver source impedance (e.g. time constant) is much greater than the bit period to prevent decay of the signal during each sample period.

Example input voltage waveforms for transmit data (Manchester encoded), and corresponding waveforms for currents $I_M$, $I_L$ and Itotal are shown in FIG. 8. VMR can be sampled at two different times to form an error discriminant. Since $I_M$ is known to be ideally zero at the end of the Manchester period (V2-802, 804 in FIG. 8) and at its maximum in the middle of the Manchester period (V1-801, 803 in FIG. 8), VMR (that represents |Ixvd|) is sampled at those two instances, in one embodiment. Any difference that exists between the two samples represents a portion of magnetizing current $I_M$ that is not cancelled by the Ixid of the current driver 624, resulting in an error signal around which the servo loop may be closed to achieve Ixvd=$I_L$.

When the error signal into integrator 620 averages to zero, the integrator output is constant. This constant output may form the basis for ramp generator 622. For instance, a constant current source, when integrated, results in a ramped current output. The generated current ramp from Ramp Generator 622 may subsequently feed into Current Driver 624 (e.g., a high impedance driver), which drives the current, Ixid, into the primary of the transformer.

Thus, a feedback loop comprising an error (receive) detector 618, error integrator 620, ramp generator 622, and current driver 624 is used, in one embodiment, for cancellation of the magnetizing inductance current, $I_M$. The voltage driver sources (or sinks) the isolated load current equivalent.

Referring to FIG. 8, the receive signal Rxd may be decoded by sampling the current Ixvd (via sensing voltage VMR) at any time in the bit period, and comparing the magnitude of the sensed value against a threshold. The threshold may be derived, for example, from the average of the two sensed levels corresponding to the two known impedance values. Alternately, given that $|I_L|$ is substantially constant throughout each of the Manchester periods, $|I_L|$ can be integrated over the entire Manchester period to form a basis for receive detection. This will make the detection more robust against noise of the system. In particular, if the receive data bit is differentially encoded into two Manchester periods, the detection reduces to a simple matter of comparing the integrated $I_L$ of the first Manchester period to that of the second period.

After decoding, the receive signal RBS is separated (e.g. demultiplexed) into data and status information in Demux 614. The data portion may comprise six bits, for example, which may subsequently be serialized into the receive bit stream, RxdBS. In addition, the status bit STA may be used to form an 8-bit wide status word.

Line Side Barrier Interface

Figure 10:
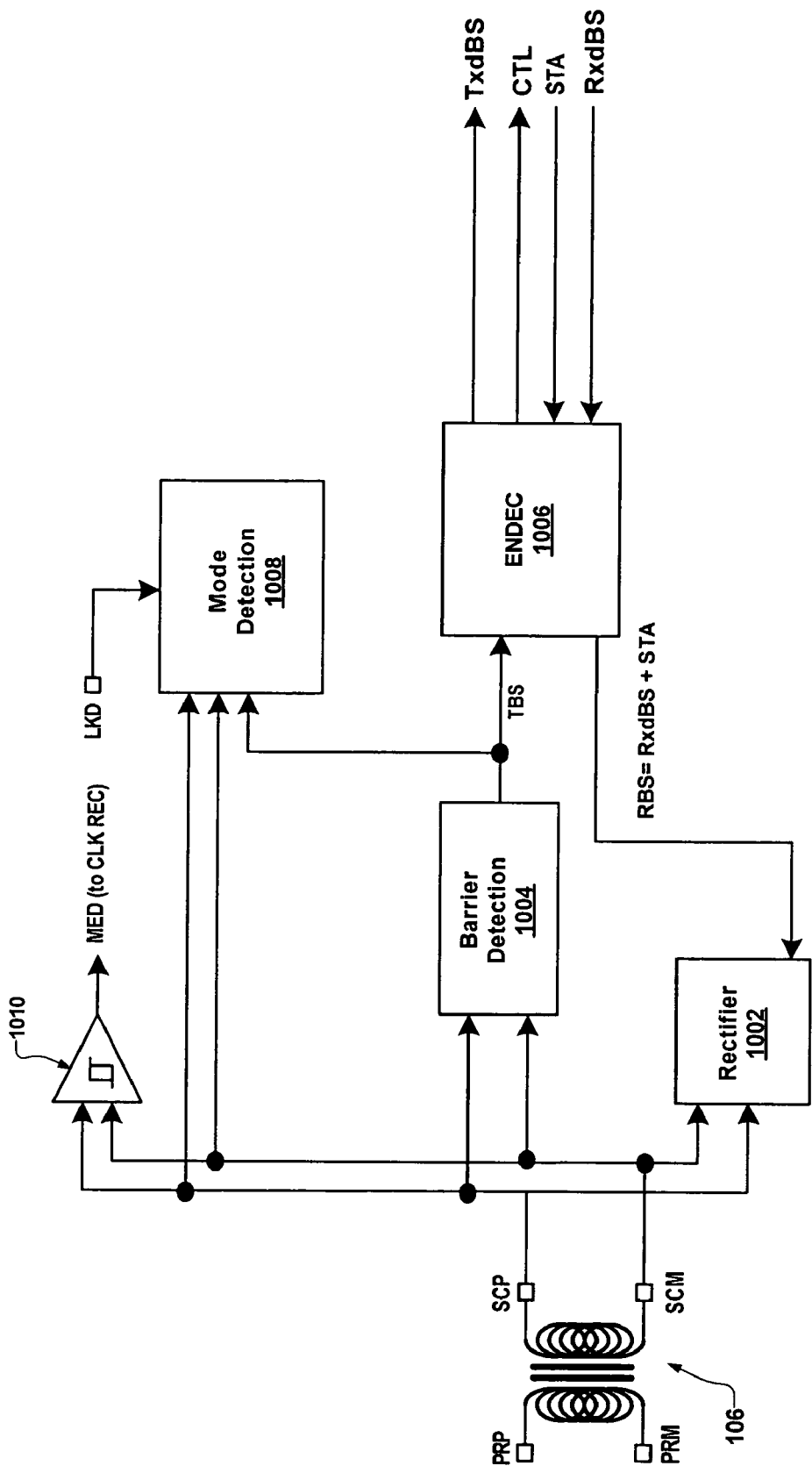
FIG. 10 is a block diagram of a line-side barrier interface in accordance with an embodiment of the present invention.

FIG. 10 is a functional illustration of an embodiment of a Line Side Barrier Interface (LSBI) 902. As illustrated, LSBI 902 comprises Rectifier 1002; Barrier Detection 1004; Encoder/Decoder (ENDEC) 1006; Mode Detection 1008; and amplifier/comparator 1010. Comparator 1010 generates and sends the transmitted Manchester Encoded Data (MED) to the clock recovery loop. MED may be raw data from the barrier or processed data generated in accordance with the illustration of FIG. 15B to ease the task of clock recovery, depending on the state of the clock recovery loop.

In one embodiment, the barrier transformer 106 and the rectification scheme in Rectifier 1002 are such that 3V pulses from the HIC 104 will become 6V pulses to the LIC 108. The 6V pulses are rectified by the Rectifier 1002, which could be a diode bridge or any other rectification scheme (e.g. active or passive), on pins SCP and SCM of the transformer 106 to generate a positive supply voltage, VPX, for the LIC 108.

Barrier Detection 1004 performs raw data detection from the signal at the terminals, SCP and SCM, of the transformer.

In one embodiment, LSBI 902 identifies the state of operation by monitoring the transmit data stream, TBS, coming across the barrier from HIC 104 by checking the number of power pulses and the data pulses or by checking voltage levels of the transmit data stream (e.g., power pulses may be transmitted with a higher voltage than data pulses). For instance, the modes of operation may comprise a mixed mode and a data mode.

In Mixed mode, power transmission and full-duplex data transfer may be time division multiplexed. From reset until the assertion of an Off Hook command, HIC 104 may operate in a "Mixed Mode". During the Mixed mode, the HIC 104 may supply power to LIC 108 across the pulse transformer barrier. In some embodiments, HIC 104 may continue to deliver power to LIC 108 even after the off hook command is asserted.

In Data mode, transmit and receive data may be simultaneously and continuously exchanged between the LIC 108 and HIC 104 at twice the rate of Mixed mode as the power frames can now be used as data frames.

Figure 11A:
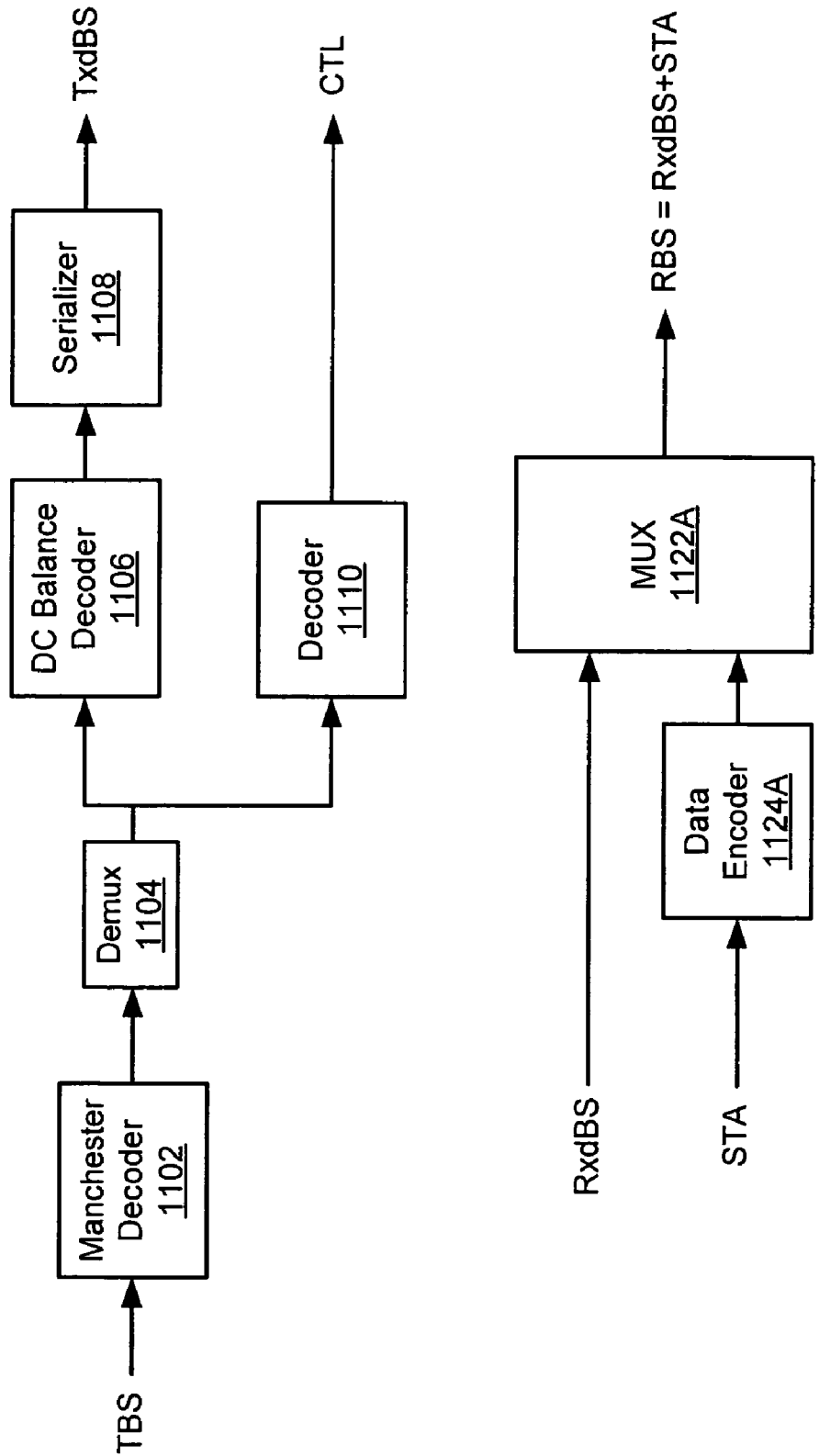
FIG. 11A is a block diagram of an encoder/decoder in accordance with an embodiment of the present invention.
Figure 11B:
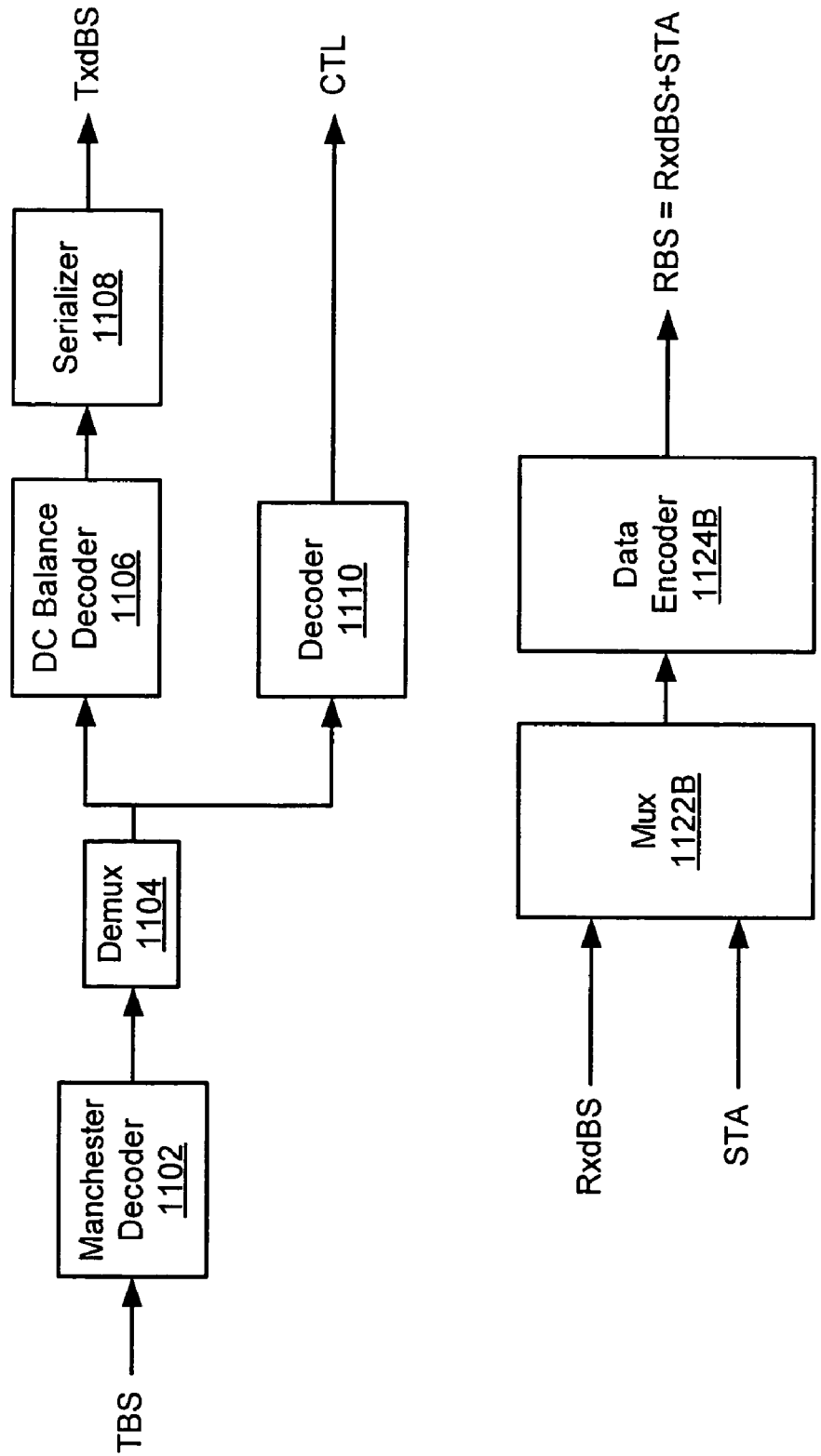
FIG. 11B is a block diagram of an encoder/decoder in accordance with another embodiment of the present invention.

Encoder/Decoder (ENDEC) 1006 performs decoding of the transmit bit stream (TBS) into CTL and TxdBS and performs the reverse of DC Balance Coding performed in 604. That is, the ENDEC 1006 recovers TxdBS (see FIG. 6) on the line side. FIGS. 11A and 11B are functional illustrations of Encoder/Decoder 1006 in accordance with embodiments of the present invention.

As illustrated in both FIGS. 11A and 11B, transmit bit stream, TBS, is Manchester decoded in block 1102 and then demultiplexed in block 1104 into a data portion and a control portion. The data portion is processed through a DC Balance Decoder (reverse of DC Balance Encoder discussed with respect to FIG. 5) in block 1106. The resulting data may be serialized in block 1108 into the recovered transmit bit stream, TxdBS. In addition, the control portion is decoded in block 1110 to generate the control bit, CTL.

Encoder/Decoder 1006 also encodes the receive data, RxdBS, which originates from Analog to Digital Converter (ADC) 908, and the status bit, STA, to generate the composite signal RBS (=RxdBS+STA). In blocks 1122 and 1124, the receive data, RxdBS, and the Status bit, STA, may be encoded for transmission across the barrier.

Referring to the embodiment of FIG. 11A, the status bit, STA, may be Manchester encoded in block 1124A and then combined with the uncoded receive bit stream, RxdBS, in block 1122A to form RBS, which is illustrated in FIG. 12A as "Encoded Rxdata". In this embodiment, the encoding scheme first does Manchester encoding of the Status bit into two bits in block 1124A and places one of the bits at the beginning of three of six bits of data and the other at the beginning of the remaining three of the same six data bits in block 1122A. The resulting bit pattern is further illustrated graphically in FIG. 12A. In this embodiment, special encoding of the RxdBS bits is not required and thus not shown. Also, note that a status bit of "0" is encoded in both the illustrations of FIGS. 12A and 12B. In contrast, if the status bit is "1" (i.e. STA=1), the encoded data would have its bit pattern reversed. That is, a "1" in the first position of the status bit and a value of "0" in the second position of the status bit.

In another embodiment illustrated in FIG. 11B, both the status bit (STA) and the receive data bit stream (RxdBS) are multiplexed in block 1122B and then Manchester encoded within block 1124B to generate the receive bit stream, RBS. The resulting bit pattern is illustrated in FIG. 12B.

The formed received bit stream (i.e. RBS) is then transmitted to the HIC. When HIC 104 detects the RBS, it frames the bits and decodes the data accordingly. Thus, for instance into seven bits of data—six bits of receive data, RxdBS, and one bit of STA, if the RBS was formed in the LIC using the embodiment illustrated in FIG. 11A. Also, the data may be decoded into three bits of RxdBS and one bit of STA if RBS was formed in the LIC using the embodiment illustrated in FIG. 11B.

Clock Recovery

One factor facilitating bi-directional communication across the barrier is having both the HIC and the LIC locked in time (synchronized). For example, switch Rxd 302 in FIG. 3A is preferably opened and closed at the beginning or the end of the Manchester period. In other words Manchester edges in HIC should line up closely with those of the LIC.

Figure 13:
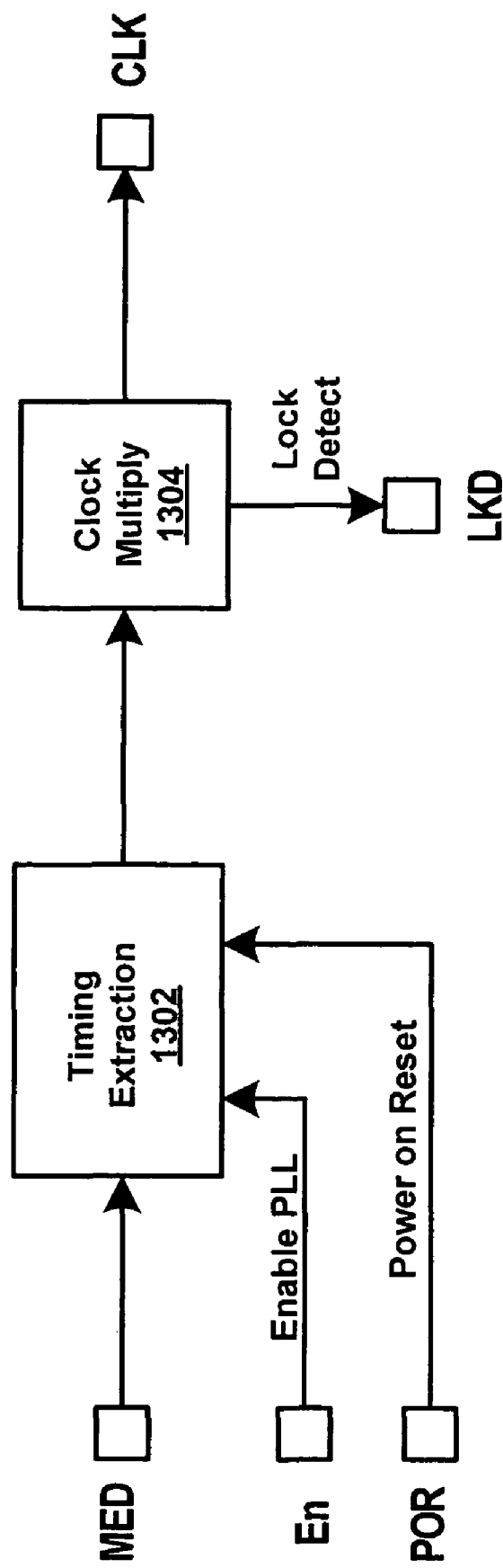
FIG. 13 is a block diagram of a clock recovery circuit in accordance with an embodiment of the present invention.

FIG. 13 is an illustration of a clock recovery circuit in accordance with an embodiment of the present invention. As illustrated, clock recovery in the LIC 108 may be performed by a Phase Lock Loop (PLL) comprising a timing extraction block 1302 and a clock multiply block 1304. Upon enablement, timing extraction block 1302 determines the frequency range of the input MED (i.e. Manchester Encoded Data) and properly sets up the Phase Lock Loop. When the PLL locks onto the MED frequency, the signal LKD is asserted and sent to LSBI 902.

The range of frequency associated with the input, MED, may vary significantly. Thus, the clock recovery circuit is preferably configured to deal with a wide frequency range.

Figure 15A:
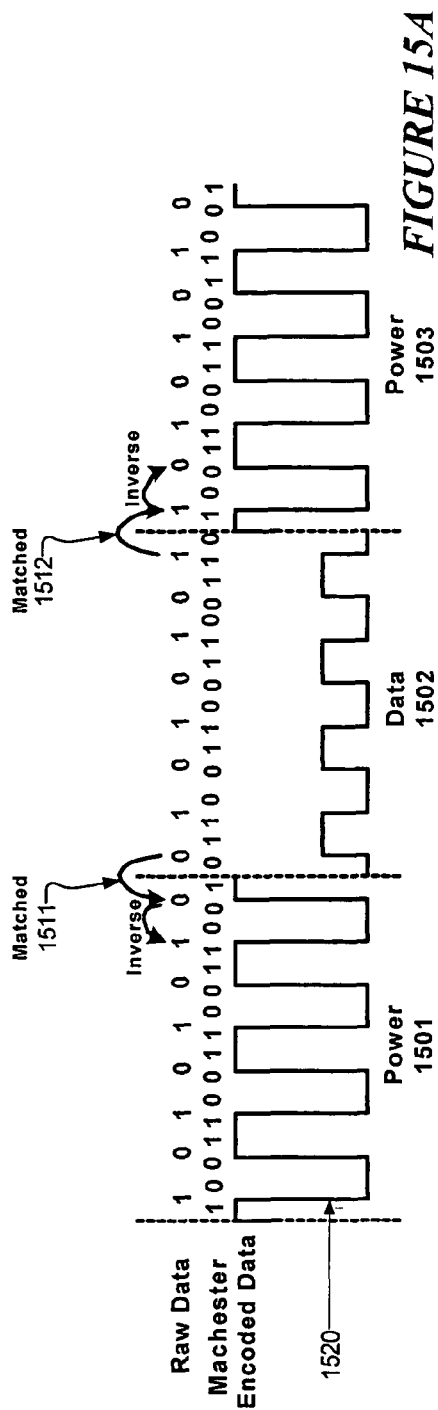
FIG. 15A is a signal diagram illustrating representative preamble pulses for clock recovery lock in accordance with an embodiment of the present invention.

To set up the clock recovery circuit, the HIC 104 may send a preamble containing only clock and power pulses as shown in FIG. 15A. There can be an irregularity in the waveform at the boundaries between power and data frames. The transformer driver for power and data frames may be configured such that the Manchester codes saddling the boundaries between power and data frames are matched. This may be achieved, for example, using a dual mode super source follower circuit.

Figure 15B:
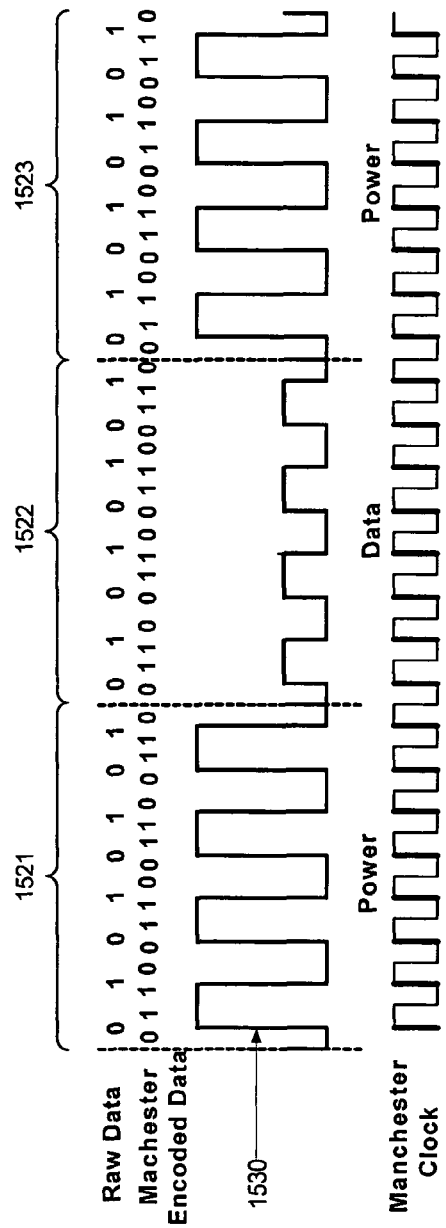
FIG. 15B is a signal diagram illustrating results of inversion of the preamble pulses for clock recovery in accordance with an embodiment of the present invention.

In one embodiment, LSBI 902 first inverts the power pulses to make them a true alternating preamble as shown in FIG. 15B. After inversion, the pulse train becomes a seamless preamble pattern at half the frequency of the Manchester clock, i.e. transitions only occur at the rising edge of the Manchester clock. This makes the initial locking process relatively easy. The Timing Extraction circuit 1302 detects the approximate frequency range of the inverted preamble. This information is then used by the PLL to properly set the PLL parameters.

Figure 14:
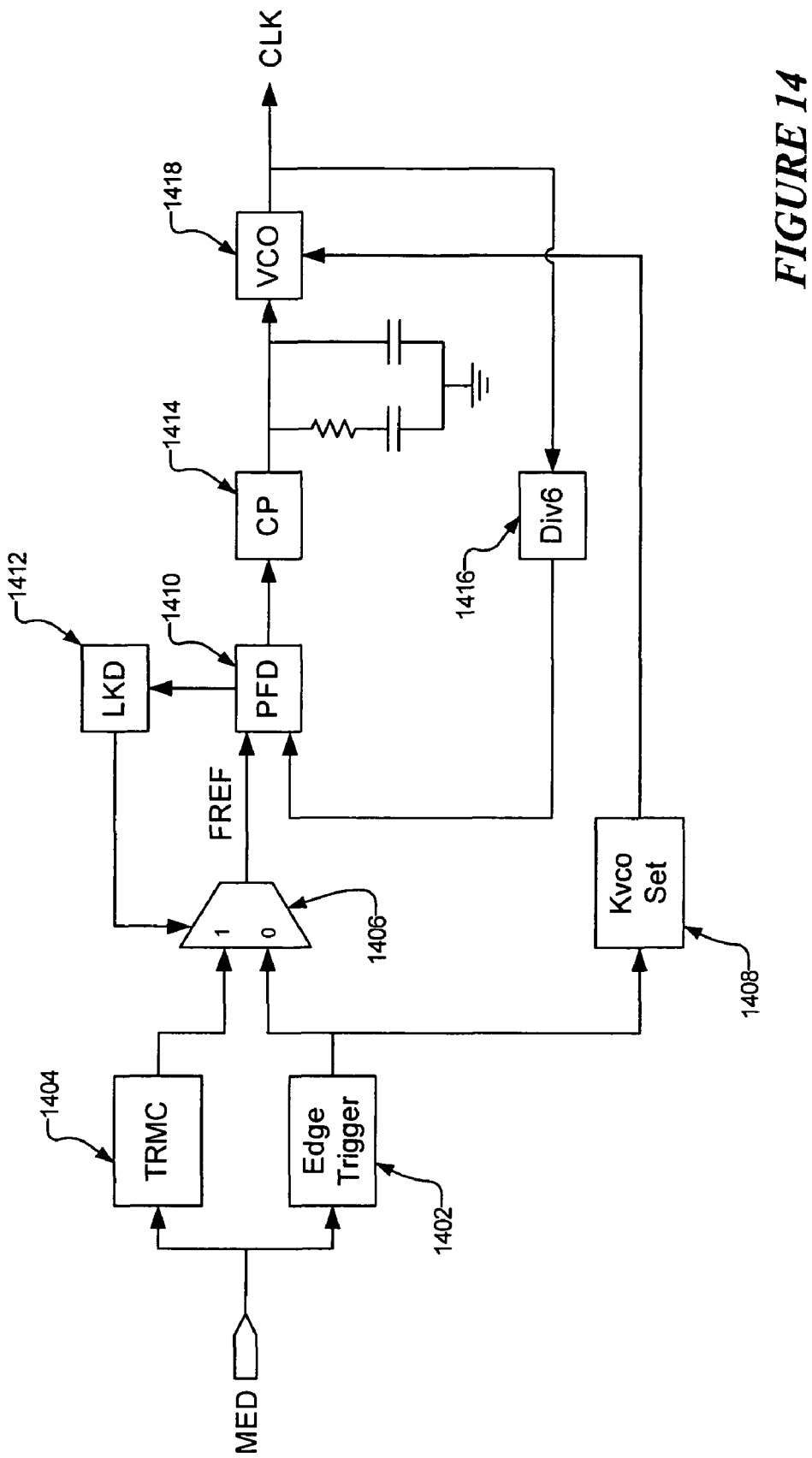
FIG. 14 is a block diagram of a phase-locked loop in accordance with an embodiment of the present invention.

FIG. 14 is a detailed illustration of a PLL in accordance with an embodiment of the present invention. The clock recovery PLL comprises an edge trigger block 1402 (that generates a one-shot at every edge of MED); Timing Recovery Manchester Encoder block (TRMC) 1404; switch 1406; phase detector (PFD) 1410; voltage controlled oscillator gain determination block (Kvco Set) 1408; lock determination block (LKD) 1412; voltage controlled oscillator (VCO) 1418; clock divider block (Div6) 1416; and Charge Pump (CP) 1414.

In one embodiment of the clock recovery circuit, there are three steps involved in acquiring a clock (CLK) that is locked to Manchester Encoded Data. The first step is to estimate the required Kvco settings (Kvco 1408) for the PLL for a given input clock (preamble) represented by the input MED. This may be accomplished by enabling Kvco counters in the clock extraction block to start counting MED edges for a specific period.

After counting is complete, the entire PLL is powered up and the final result of the counter is used to set the Kvco control bits. While counting both edges of the preamble, the generated double input frequency signal at block 1402 may be used as the reference frequency (FREF) to the PLL.

After setting the PLL Kvco control bits and powering up the entire PLL, the PLL begins the process of locking to MED (still preamble). When the PLL has successfully acquired lock, LKD signal goes high, as determined in block 1412.

Once the LKD signal goes high, FREF to the PLL may switch from the bi-directional one-shot 1402 to the output of Timing Recovery Manchester Encoder block (TRMC) 1404, which selects only the valid Manchester transition edges that are present at the constant rate (of Manchester clock). Assertion of the signal LKD may also be used to signal the LSBI 902 that it can start sending data instead of preamble clock to the MED.

Finally, CLK is conveniently multiplied up from the Manchester clock rate, e.g., six times. The rising edge of the recovered Manchester clock is aligned with the valid data transition. The recovered clock signal may then be used in all circuitry on the line side requiring timing information (e.g., an ADC block 908 and ENDEC block 1006).

Thus, a feedback loop for cancellation of magnetizing current in a transformer circuit of a data access arrangement has been described. Particular embodiments described herein are illustrative only and should not limit the present invention thereby. The invention is defined by the claims and their full scope of equivalents.

The invention claimed is:

1. An apparatus with feedback for cancellation of magnetizing inductance current comprising:
    a transformer having a primary side and a secondary side, said transformer having a magnetizing inductance current and a load current due to a voltage signal asserted on said primary side;
    a first circuit component coupled to said primary side of said transformer, said first circuit component generating said voltage signal; and
    a feedback circuit coupled to said first circuit component and said primary side of said transformer, said feedback circuit providing a compensating current to cancel said magnetizing inductance current,
    wherein said voltage signal is a double DC balanced digital signal.

2. An apparatus with feedback for cancellation of magnetizing inductance current comprising:
    a transformer having a primary side and a secondary side, said transformer having a magnetizing inductance current and a load current due to a voltage signal asserted on said primary side;
    a first circuit component coupled to said primary side of said transformer, said first circuit component generating said voltage signal, wherein said first circuit component comprises:
        a DC balanced encoder; and
        a 1b/2b encoder coupled to said DC balanced encoder; and
    a feedback circuit coupled to said first circuit component and said primary side of said transformer, said feedback circuit providing a compensating current to cancel said magnetizing inductance current.

3. An apparatus with feedback for cancellation of magnetizing inductance current comprising:
    a transformer having a primary side and a secondary side, said transformer having a magnetizing inductance current and a load current due to a voltage signal asserted on said primary side;
    a first circuit component coupled to said primary side of said transformer, said first circuit component generating said voltage signal; and
    a feedback circuit coupled to said first circuit component and said primary side of said transformer, said feedback circuit providing a compensating current to cancel said magnetizing inductance current, wherein said feedback circuit comprises:
        an error detector coupled to said first circuit component, said error detector providing a current error;
        an error integrator receiving said current error and providing a ramp control signal; and
        a current generator receiving said ramp control signal and providing said compensating current to cancel said magnetizing inductance current.

4. The apparatus of claim 3, wherein said voltage signal has a bit period and said error detector is configured to sample said load current at a plurality of sample points within said bit period.

5. The apparatus of claim 4, wherein said plurality of sample points comprise an end point and a mid point of a Manchester clock period.

6. An apparatus with feedback for cancellation of magnetizing inductance current comprising:
    a transformer having a primary side and a secondary side, said transformer having a magnetizing inductance current and a load current due to a voltage signal asserted on said primary side;
    a first circuit component coupled to said primary side of said transformer, said first circuit component generating said voltage signal, wherein said first circuit component comprises a receive detector that detects a receive signal from level changes in said load current; and
    a feedback circuit coupled to said first circuit component and said primary side of said transformer, said feedback circuit providing a compensating current to cancel said magnetizing inductance current.

7. The apparatus of claim 6, further comprising an impedance modulator coupled to said secondary side of said transformer, said impedance modulator producing said level changes in said load current.

8. A method for cancellation of magnetizing inductance current in a transformer based circuit, comprising:
    detecting a change in output current between two time instances for a voltage driver asserting a voltage signal across a primary side of a transformer, said change in output current attributable to a magnetizing inductance current;
    providing a current control signal based on said change in output current;
    providing a compensating current to said primary side of said transformer based on said current control signal, said compensating current approximating said magnetizing inductance current and substantially canceling said magnetizing inductance current from said output current of said voltage driver; and
    double DC balancing said voltage signal.

9. The method of claim 8, wherein said double DC balancing comprises:
    passing a transmit bit stream through a DC balanced encoder to generate an intermediate data stream; and
    passing said intermediate data stream through a 1b/2b encoder to generate said voltage signal.

10. A method for cancellation of magnetizing inductance current in a transformer based circuit, comprising:
- detecting a change in output current between two time instances for a voltage driver asserting a voltage signal across a primary side of a transformer, said change in output current attributable to a magnetizing inductance current;
- providing a current control signal based on said change in output current;
- providing a compensating current to said primary side of said transformer based on said current control signal, said compensating current approximating said magnetizing inductance current and substantially canceling said magnetizing inductance current from said output current of said voltage driver; and
- wherein providing a current control signal comprises: integrating a current error obtained from said change in output current.

11. A method for cancellation of magnetizing inductance current in a transformer based circuit, comprising:
- detecting a change in output current between two time instances for a voltage driver asserting a voltage signal across a primary side of a transformer, said change in output current attributable to a magnetizing inductance current;
- providing a current control signal based on said change in output current;
- providing a compensating current to said primary side of said transformer based on said current control signal, said compensating current approximating said magnetizing inductance current and substantially canceling said magnetizing inductance current from said output current of said voltage driver; and
- wherein providing said compensating current comprises generating a current ramp based on said current control signal.

12. A method for cancellation of magnetizing inductance current in a transformer based circuit, comprising:
- detecting a change in output current between two time instances for a voltage driver asserting a voltage signal across a primary side of a transformer, said change in output current attributable to a magnetizing inductance current;
- providing a current control signal based on said change in output current;
- providing a compensating current to said primary side of said transformer based on said current control signal, said compensating current approximating said magnetizing inductance current and substantially canceling said magnetizing inductance current from said output current of said voltage driver; and
- wherein detecting said change in output current comprises sampling said output current while a load current of said transformer is substantially constant.

13. The method of claim 12, wherein said load current is generated in synchronization with a Manchester clock in the primary side of said transformer.

14. An apparatus for canceling a magnetizing inductance current in a transformer circuit having a voltage driver coupled to a first inductor, comprising:
- an error detector configured to sense a change in output current of said voltage driver during a period when a voltage output of said voltage driver is substantially constant, said error detector providing a current error;
- an error integrator coupled to said error detector and providing a current control signal; and
- a current ramp circuit configured to provide a current ramp signal to said first inductor based on said current control signal, wherein said current ramp signal is synchronized with said voltage output of said voltage driver.

15. The apparatus of claim 14 further comprising:
- a DC balancing circuit coupled to said voltage driver, said DC balancing circuit configured to enforce DC balancing of current and voltage characteristics of an input signal to said voltage driver.

16. The apparatus of claim 14, wherein said error detector is configured to sample said output current at a mid point and an end point of a Manchester clock period.

17. The apparatus of claim 14, wherein said error detector comprises a current mirror circuit providing an error sense signal proportional to a magnitude of said output current.

18. A method for canceling a magnetizing inductance current of a transformer comprising:
- providing an adjustable ramp current to a port of said transformer;
- applying a polarity change to said adjustable ramp current in synchronization with a state transition of an input voltage signal at said port;
- detecting a change in current across said port of said transformer when said input voltage signal is substantially constant;
- providing an error discriminant from said change in current; and
- adjusting a slope of said adjustable ramp current based on said error discriminant.

* * * * *

UNITED STATES PATENT AND TRADEMARK OFFICE
CERTIFICATE OF CORRECTION

PATENT NO. : 7,839,938 B2  Page 1 of 1
APPLICATION NO. : 11/477136
DATED : November 23, 2010
INVENTOR(S) : Russell Hershbarger It is certified that error appears in the above-identified patent and that said Letters Patent is hereby corrected as shown below:

Col. 3, Line 16, after "is" insert --a--.
Col. 5, Line 62, delete "$Tx_{13}D203$ and $Rx_{13} D 204$" and insert --Tx_D 203 and Rx_D 204--.
Col. 5, Line 64, delete "$Tx_{13} D 203$" and insert --Tx_D 203--.
Col. 5, Line 65, delete "$Rx_{13} D 204$" and insert --Rx_D 204--.
Col. 6, Line 4, delete "$Tx_{13}D 203$" and insert --Tx_D 203--.
Col. 6, Line 40, delete "$Rx_{13} D 204$" and insert --RX_D 204--.
Col. 6, Line 42, delete "$Rx_{13}D 204$" and insert --RX_D 204--.
Col. 7, Line 23, delete "Sinc ○3" and insert --Sinc ˆ3 --.
Col. 8, Line 11, delete "Iout" and insert --Iout--.
Col. 17, Line 16, delete ":" after "comprises".

Signed and Sealed this
Second Day of October, 2012

David J. Kappos
*Director of the United States Patent and Trademark Office*